(12) United States Patent
Kogure

(10) Patent No.: US 8,789,263 B2
(45) Date of Patent: Jul. 29, 2014

(54) CARRIER DISASSEMBLING APPARATUS AND CARRIER DISASSEMBLING METHOD

(75) Inventor: Yoshinari Kogure, Saitama (JP)

(73) Assignee: Advantest Corporation, Tokyo (JP)

( * ) Notice: Subject to any disclaimer, the term of this patent is extended or adjusted under 35 U.S.C. 154(b) by 441 days.

(21) Appl. No.: 13/098,601

(22) Filed: May 2, 2011

(65) Prior Publication Data

US 2011/0277293 A1 Nov. 17, 2011

(30) Foreign Application Priority Data

May 10, 2010 (JP) ................. 2010-108516

(51) Int. Cl.
*B23P 21/00* (2006.01)
(52) U.S. Cl.
USPC ............................................. 29/705
(58) Field of Classification Search
USPC ............. 29/426.1, 700, 426.3, 426.5, 426.6, 29/743, 705, 721, 729; 324/755, 760, 761, 324/754, 763, 158.1
See application file for complete search history.

(56) References Cited

U.S. PATENT DOCUMENTS

| | | | |
|---|---|---|---|
| 5,757,199 | A | 5/1998 | Maruyama |
| 6,340,838 | B1 | 1/2002 | Chung et al. |
| 6,426,878 | B2 | 7/2002 | Tanioka et al. |
| 6,741,090 | B2 | 5/2004 | Yamashita |
| 2002/0012233 | A1 | 1/2002 | Tanioka et al. |

FOREIGN PATENT DOCUMENTS

| | | |
|---|---|---|
| JP | 56-024411 | 3/1981 |
| JP | 7-263504 | 10/1995 |
| JP | 8-69848 | 3/1996 |
| JP | 09-292145 | 11/1997 |
| JP | 10-213627 | 8/1998 |
| JP | 11-326449 | 11/1999 |
| JP | 2000-003984 | 1/2000 |
| JP | 2000-249739 | 9/2000 |
| JP | 2002-059908 | 2/2002 |
| JP | 2003-266419 | 9/2003 |
| JP | 2003-344484 | 12/2003 |

OTHER PUBLICATIONS

Korea Office action, mail date is Jul. 26, 2012.
China Office action, mail date is May 2, 2013.
Japan Office action, mail date is Feb. 18, 2014.

*Primary Examiner* — John C Hong
(74) *Attorney, Agent, or Firm* — Greenblum & Bernstein P.L.C.

(57) ABSTRACT

[Object] To provide a carrier disassembling apparatus capable of disassembling a carrier for test.
[Means for solving] A carrier disassembling apparatus 1, which disassembles a carrier for test 60, comprises a holding head 11 that holds a cover member 80, a holding table 20 that holds a base member 70, and a first carrier arm 16 that causes the holding head 11 to depart relatively from the holding table 20 to separate the cover member 80 and the base member 70 from each other, the holding head 11 has a first closing member 12 that forms a first closed space 13 between the holding head 11 and the cover member 80, the holding table 20 has a second closing member 21 that forms a second closed space 24 between the holding table 20 and the base member 70, and the carrier disassembling apparatus 1 further comprises a vacuum pump 90 that reduces pressure within the closed spaces 13 and 24.

14 Claims, 29 Drawing Sheets

CARRIER DISASSEMBLING APPARATUS AND CARRIER DISASSEMBLING METHOD

TECHNICAL FIELD

The present disclosure relates to a carrier disassembling apparatus and a carrier disassembling method for disassembling a carrier for test in which an electronic device is temporarily mounted to test the electronic device.

BACKGROUND ART

As a carrier for test in which a die having been diced from a semiconductor wafer is temporarily mounted, a carrier for test is known which nips the die between a film and a case (refer to Patent Document 1, for example).

[Prior Art Document(s)]
[Patent Document(s)]
[Patent Document 1] Published Patent Application No. H07-263504

SUMMARY OF THE INVENTION

Problems to be Solved by the Invention

According to the above technique, in order to finally package as a product the die completed to be tested, the carrier for test is necessary to be disassembled.

Problems to be solved by the present invention or objects of the present invention include providing a carrier disassembling apparatus and a carrier disassembling method which allow a carrier for test to be disassembled.

Means for Solving the Problems

The carrier disassembling apparatus according to the present invention is a carrier disassembling apparatus for disassembling a carrier for test having a cover member and a base member between which an electronic device is nipped, characterized in that the carrier disassembling apparatus comprises: a holding head that holds the cover member; a first holding table that holds the base member; and a separating means that causes the holding head to depart relatively from the first holding table to separate the cover member and the base member from each other, the holding head has a first closing means that forms a first closed space between the holding head and the cover member, the first holding table has a second closing means that forms a second closed space between the first holding table and the base member, and the carrier disassembling apparatus further comprises: a first decompression means that reduces pressure within the first closed space; and a second decompression means that reduces pressure within the second closed space (refer to claim 1).

In the above invention, the electronic device may be accommodated in an accommodating space between the cover member and the base member of the carrier for test, and the accommodating space may be decompressed relative to an external air (refer to claim 2).

In the above invention, the first closing means may have a pipe shape with bottom formed with a first opening larger than the electronic device, the second closing means may have a recessed shape formed with a second opening larger than the electronic device, the first opening may be covered by the cover member to form the first closed space, and the second opening may be covered by the base member to form the second closed space (refer to claim 3).

In the above invention, the carrier disassembling apparatus may further comprises a holding means that is provided within the recessed shape of the second closing means and holds the electronic device via the base member (refer to claim 4).

In the above invention, the separating means may separate the cover member and the base member of the carrier for test from each other, and the carrier for test is intervening between the first closed space decompressed and the second closed space decompressed (refer to claim 5).

In the above invention, the separating means may have a rotation means that rotates the holding head relative to the first holding table (refer to claim 6).

In the above invention, the cover member may have a first rigid plate, the base member may have: a second rigid plate having a center opening; and a film-like member having flexibility and laminated on a portion of the second rigid plate including the center opening, and the carrier disassembling apparatus may further comprise a pressing means that presses the first rigid plate through the center opening (refer to claim 7).

In the above invention, the pressing means may have: a contact member having a contact plane that surface contacts with an exposed area of the film-like member exposed through the center opening; and a moving means that causes the contact member to move relative to the film-like member (refer to claim 8).

In the above invention, the pressing means may have: a contact member having a contact portion that substantially line contacts or point contacts with an exposed area of the film-like member exposed through the center opening; and a moving means that causes the contact member to move relative to the film-like member (refer to claim 9).

In the above invention, the pressing means may have: a contact member that contacts with an exposed area of the film-like member exposed through the center opening; and a biasing means that biases the contact member toward the film-like member, and the contact member may contact with the film-like member through the center opening when the carrier for test is placed on the first holding table (refer to claim 10).

In the above invention, the first holding table may have an accommodating part to accommodate the base member, and the carrier disassembling apparatus may further comprise a dust collection apparatus having suction holes arranged around the accommodating part (refer to claim 11).

In the above invention, the carrier disassembling apparatus may further comprise a dust collection apparatus having a suction hole and a dust collection cover connected with the suction hole (refer to claim 12).

In the above invention, the carrier disassembling apparatus may further comprise an insertion means that inserts a plate-like member between the cover member and the base member, and a second holding table that holds the base member (refer to claim 13).

In the above invention, the first holding table and the second holding table may be provided as an identical table (refer to claim 14).

The carrier disassembling method according to the present invention is a carrier disassembling method for disassembling a carrier for test having a cover member and a base member between which an electronic device is nipped, wherein the carrier disassembling method may comprise: a first closing step that forms a first closed space on the cover member; a first decompression step that reduces pressure within the first closed space; a second closing step that forms a second closed space on the base member; a second decompression step that reduces pressure within the second closed space; and a separating step that separates the cover member and the base member of the carrier for test from each other, and the carrier for test is intervening between the first closed space decompressed and the second closed space decompressed (refer to claim 15).

In the above invention, the electronic device may be accommodated in an accommodating space between the cover member and the base member of the carrier for test, and the accommodating space may be decompressed relative to an external air (refer to claim 16).

In the above invention, the separating step may include rotating the cover member relative to the base member (refer to claim 17).

In the above invention, the cover member may have a first rigid plate, the base member may have: a second rigid plate formed therein with a center opening; and a film-like member having flexibility and laminated on a portion of the second rigid plate including the center opening, and the carrier disassembling method may further comprise a pressing step that presses the first rigid plate through the center opening (refer to claim 18).

In the above invention, the carrier disassembling method may further comprise an insertion step that inserts a plate-like member between the cover member and the base member (refer to claim 19).

In the above invention, the carrier disassembling method may further comprise a dust collection step that suctions a dust caused from disassembling the carrier for test (refer to claim 20).

In the above invention, the separating step may be perform while holding the electronic device via the base member (refer to claim 21).

Advantageous Effect of the Invention

According to the present invention, while the first depression means reduces the pressure within the first closed space and the second depression means reduces the pressure within the second closed space, the separating means causes the cover member and the base member to be separated from each other, thereby capable of disassembling the carrier for test.

EMBODIMENTS FOR CARRYING OUT THE INVENTION

Hereinafter, embodiments of the present invention will be described with reference to the drawings.

First Embodiment

Figure 1:
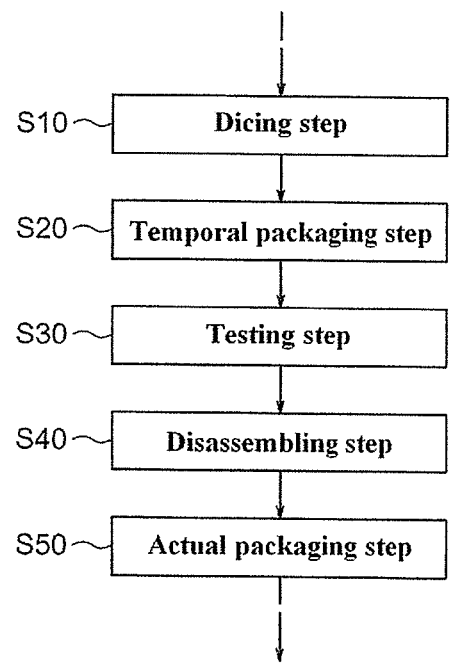
FIG. 1 is a flowchart illustrating a part of device manufacturing process according to a first embodiment of the present invention.

FIG. 1 is a flowchart illustrating a part of device manufacturing process according to the present embodiment.

In the present embodiment, after dicing a semiconductor wafer (after step S10 in FIG. 1) and prior to finally packaging (prior to step S50), electronic circuit elements created in and/or on a die are to be tested (steps S20 to S40). At this time, in the present embodiment, initially the die 61 is temporarily mounted in a carrier for test 60 (step S20). Then the die 61 and a test apparatus (not shown) are electrically connected via this carrier for test 60, thereby to perform tests with respect to electronic circuit elements created within the die 61 (step S30). Subsequently, after concluding such tests, the carrier for test 60 is disassembled (step S40), and the die 61 is actually packaged to complete a device as a final product (step S50).

First of all, the configuration of the carrier for test 60 will be described in which a die 61 is to be temporarily mounted (provisionally packaged) for test in accordance with the present embodiment. Note that the die 61 in the present embodiment represents one example of the electronic device in the present invention.

FIG. 2 to FIG. 5 illustrate a carrier for test according to the present embodiment.

Figure 2:
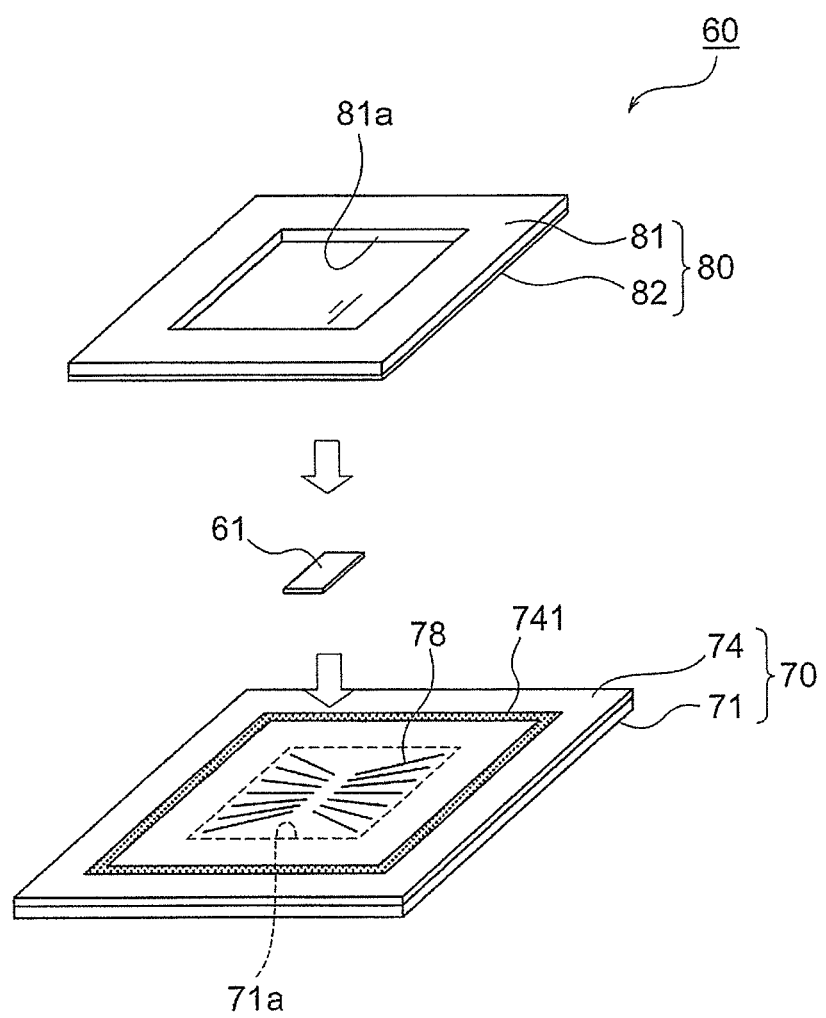
FIG. 2 is an exploded perspective view illustrating a carrier for test according to the first embodiment of the present invention.
Figure 3:
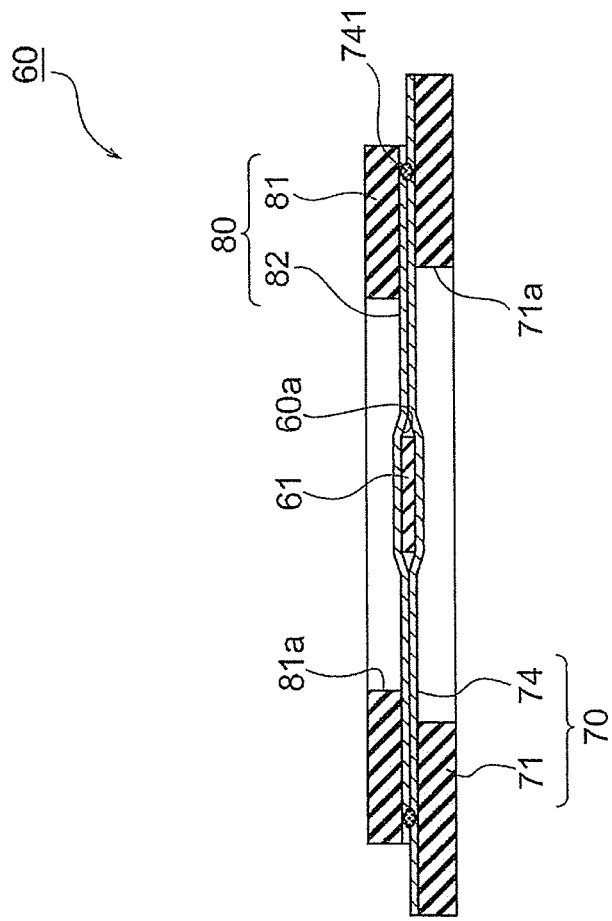
FIG. 3 is a cross-sectional view illustrating the carrier for test according to the first embodiment of the present invention.
Figure 4:
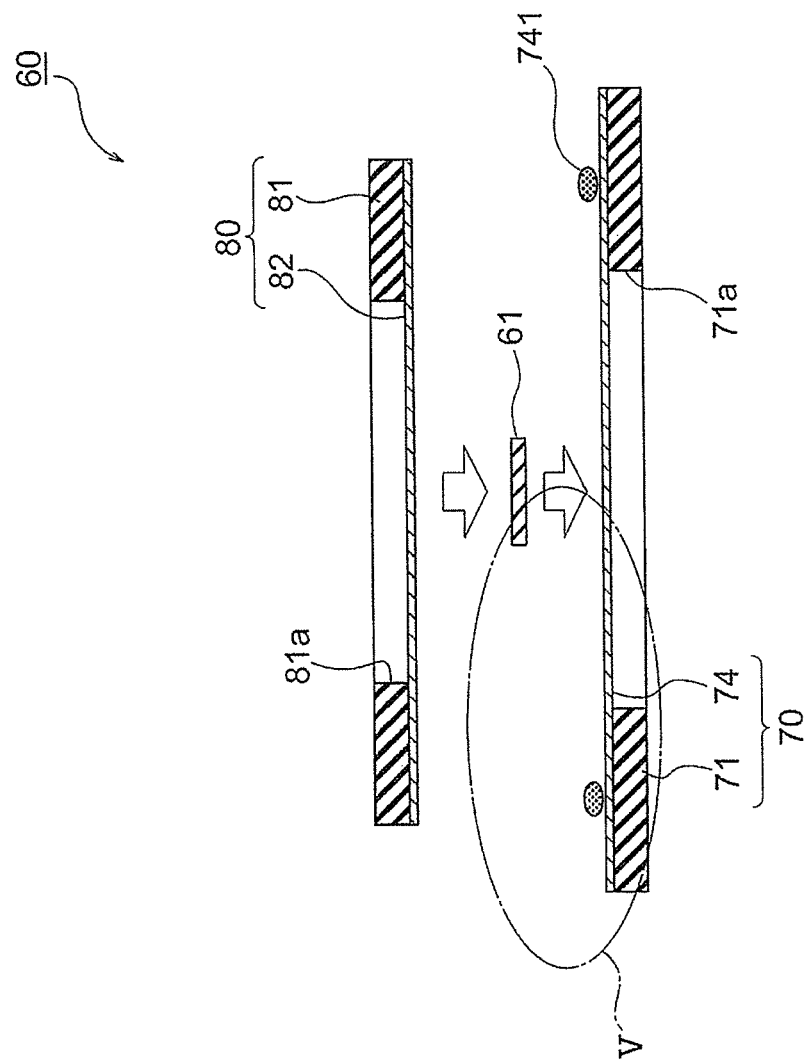
FIG. 4 is an exploded cross-sectional view illustrating the carrier for test according to the first embodiment of the present invention.

The carrier for test 60 according to the present embodiment comprises, as shown in FIG. 2 to FIG. 4, a base member 70 which is formed thereon with wiring patterns 76 and 78 (refer to FIG. 5) and to which a die 61 is to be mounted, and a cover member 80 that is overlie on the base member 70. This carrier for test 60 nips the die 61 between the base member 70 and the cover member 80 thereby to hold the die 61.

The base member 70 comprises a rigid plate 71 formed therein with a center opening 71a, and a film-like member 74 laminated over the whole surface of the rigid plate 71 including the center opening 71a. This film-like member 74 is deformable at its center area while being un-deformable at its outer area due to the rigid plate 71 thereby improving the handling ability of the carrier for test 60. Note that the rigid plate 71 in the present embodiment represents one example of the second rigid plate in the present invention, and the center opening 71a in the present embodiment represents one example of the center opening in the present invention.

The rigid plate 71 is configured of, for example, polyamide-imide resin, ceramic, glass, etc. In contrast, the film-like member 74 is configured of a material, such as polyimide resin, which has an appropriate flexibility.

Figure 5:
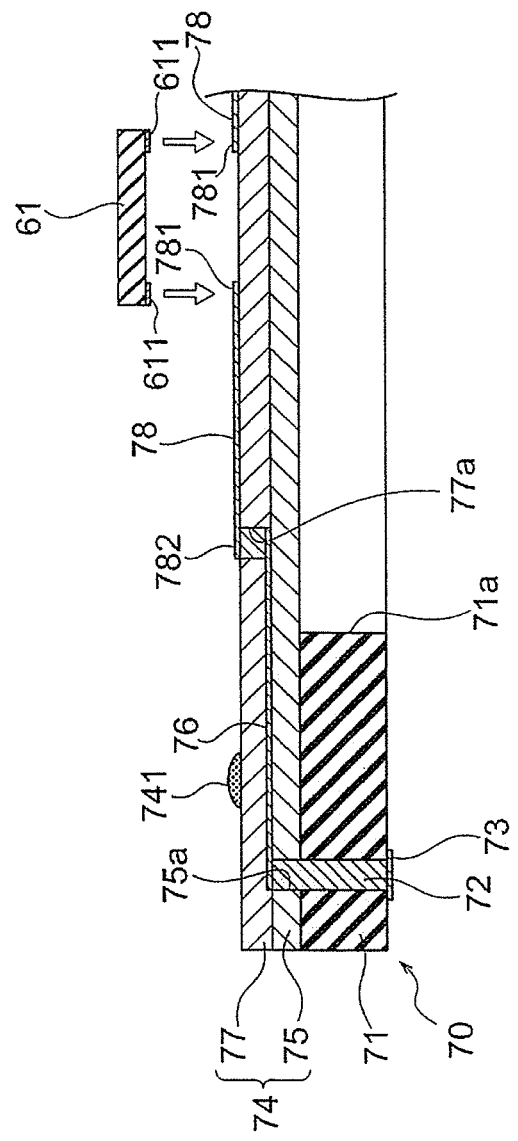
FIG. 5 is an enlarged cross-sectional view of the part V of FIG. 4.

The film-like member 74 has, as shown in FIG. 5, a base film 75 formed thereon with second wiring patterns 76, and a coverlay 77 covering the base film 75.

First wiring patterns 78 shown in FIG. 5 are formed by ink jet printing onto the coverlay 77, for example. In contrast, the second wiring patterns 76 are formed, for example, by etching a copper foil laminated on the base film 75.

Note that the forming method for such wiring patterns 76 and 78 is not particularly limited. For example, whole wiring patterns of the base member 70 may be formed by etching copper foils laminated on the base film 75. Alternatively, whole wiring patterns of the base member 70 may be formed by ink-jet printing those wiring patterns on the coverlay 77.

One end of each first wiring pattern 78 is connected with one end of each second wiring pattern 76 via a penetrating hole 77a formed in the coverlay 77. On the other end of each first wiring pattern 78, a pad 781 that is to be connected with each input and output terminal 611 of the die 61 is formed.

The rigid plate 71 is penetrated by a through-hole 72 at a position corresponding to the other end of second wiring pattern 76. The second wiring pattern 76 is connected via a penetrating hole 75a formed in the base film 75 to the through-hole 72, and the through-hole 72 is connected to a connecting terminal 73 formed on the lower surface of the rigid plate 71. This connecting terminal 73 is to be contacted with a contact pin of a test apparatus during the test for electronic devices created within the die 61.

Note that the other end of each second wiring pattern 76 may alternatively be positioned inside of the center opening 71a of the rigid plate 71 and the connecting terminal 73 may thus be formed on the lower surface of the film-like member 74. Alternatively, the other end of each second wiring pattern 76 may be exposed upward and the connecting terminal 73 may thus be formed on the upper surface of the film-like member 74.

Referring again to FIG. 2 to FIG. 4, the cover member 80 comprises a rigid plate 81 formed therein with a center opening 81a, and a film-like member 82 laminated on the rigid plate 81. The film-like member 82 is deformable at its center area while being un-deformable at its outer area due to the rigid plate 81. Note that the rigid plate 81 in the present embodiment represents one example of the first rigid plate in the present invention.

In the present embodiment, as shown in FIG. 3, the center opening 81a of the cover member 80 is smaller than the center opening 71a of the base member 70, and therefore a part of the rigid plate 81 is positioned above the center opening 71a of the base member 70.

The rigid plate 81 is configured of for example, polyamide-imide resin, ceramic, glass, etc. In contrast, the film-like member 82 is configured of a material, such as polyimide resin, which has an appropriate flexibility.

Note that the cover member 80 may alternatively be comprised only of a rigid plate 81 not formed therein with the center opening 81a. Moreover, the present embodiment involves the cover member 80 not having any wiring pattern, but the present invention is not particularly limited to this, and alternatively to the base member 70 or in addition to the base member 70, the cover member 80 may be formed thereon with wiring patterns.

The above-described carrier for test 60 is assembled in the following manner. That is, after placing the die 61 on the base member 70 in the status where the input and output terminals 611 are aligned with respect to the pads 781, the cover member 80 is overlapped on the base member 70 under reduced pressure. Note that, in the present embodiment, the input and output terminals 611 of the die 61 and the pads 781 of the film-like member 74 are not fixed to one another by means of soldering and the like.

Thereafter, if the base member 70 and the cover member 80 are returned to be in the external air in the status where the die 61 nipped therebetween, then an accommodating space 60a (refer to FIG. 3) between the base member 70 and the cover member 80 comes to be lower pressure than the external air (atmospheric pressure). Consequently, the difference of pressure between the external of the carrier for test 60 and the internal (accommodating space 60a) causes the die 61 to intervene and to be held between the base member 70 and the cover member 80, thereby allowing the input and output terminals 611 of the die 61 and the pads 781 of the film-like member 74 to contact with one another.

Alternatively, if the thickness of the die 61 is relatively large, then, in an opposite manner to the configuration as shown in FIG. 3, the base member 70 and the cover member 80 may be stacked such that the rigid plate 71 directly contacts with the rigid plate 81.

Furthermore, as shown in FIG. 2 to FIG. 5, the base member 70 and the cover member 80 may be fixed to each other by means of adhesive agent 741 in order to prevent misalignment and improve sealing ability, though not particularly limited.

A carrier disassembling apparatus 1 to be used in the disassembling step S40 will now be described. Note that the carrier disassembling apparatus described hereinafter is merely an example, and the carrier disassembling apparatus according to the present invention is not particularly limited to this.

Figure 6:
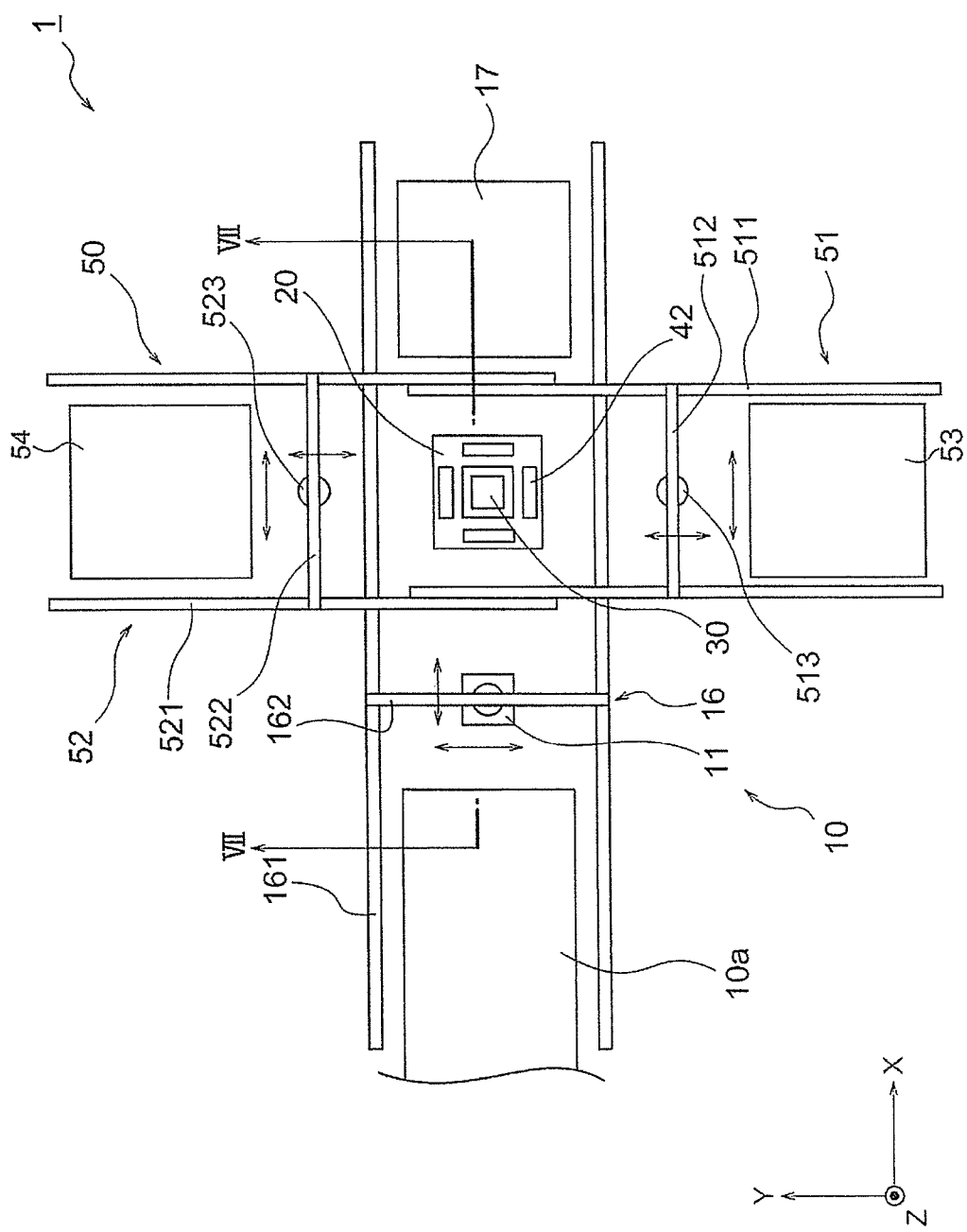
FIG. 6 is a plan view illustrating the entire configuration of a carrier disassembling apparatus according to the first embodiment of the present invention.
Figure 7:
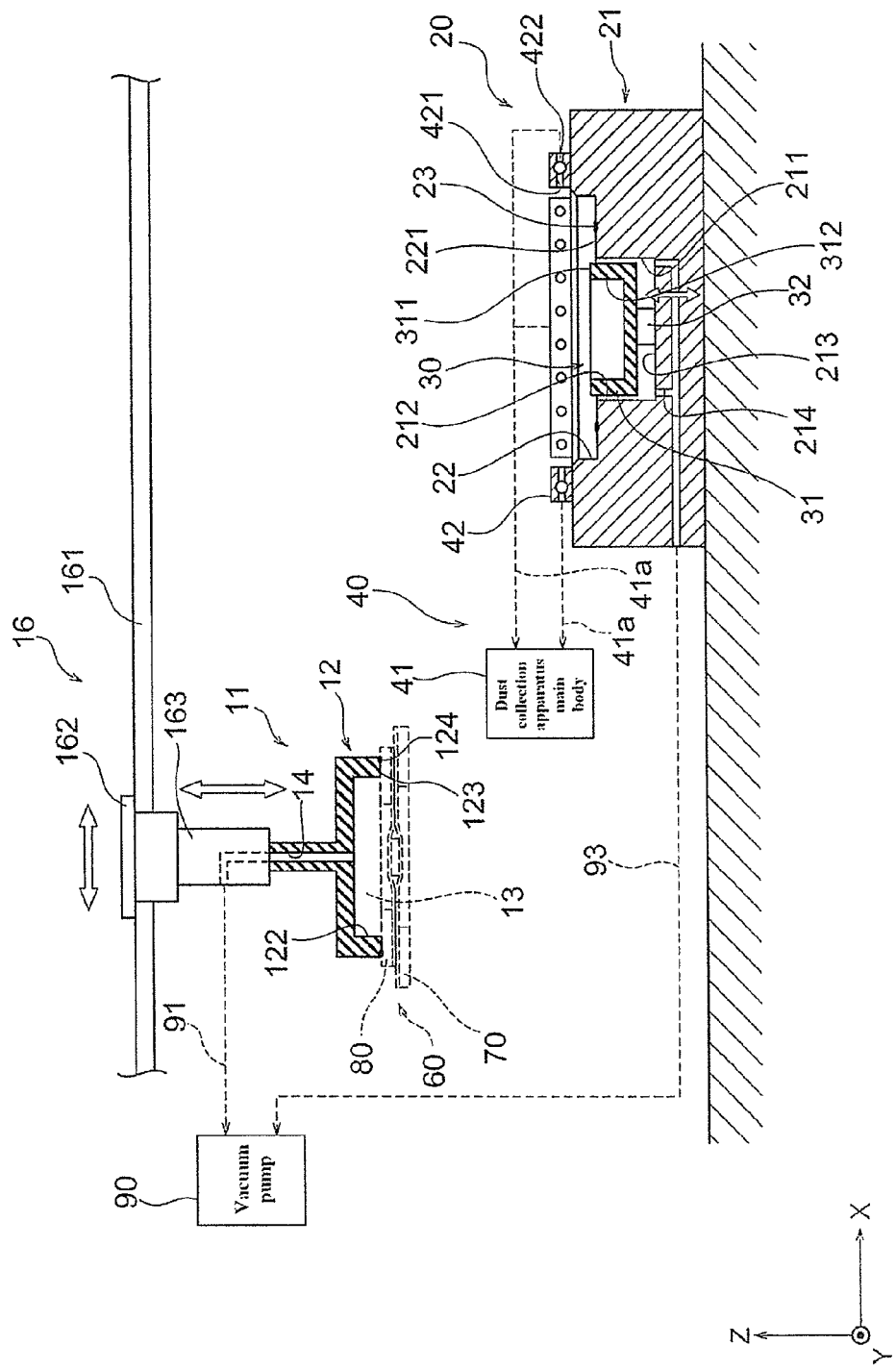
FIG. 7 is a cross-sectional view along the line VII-VII of FIG. 6.
Figure 8:
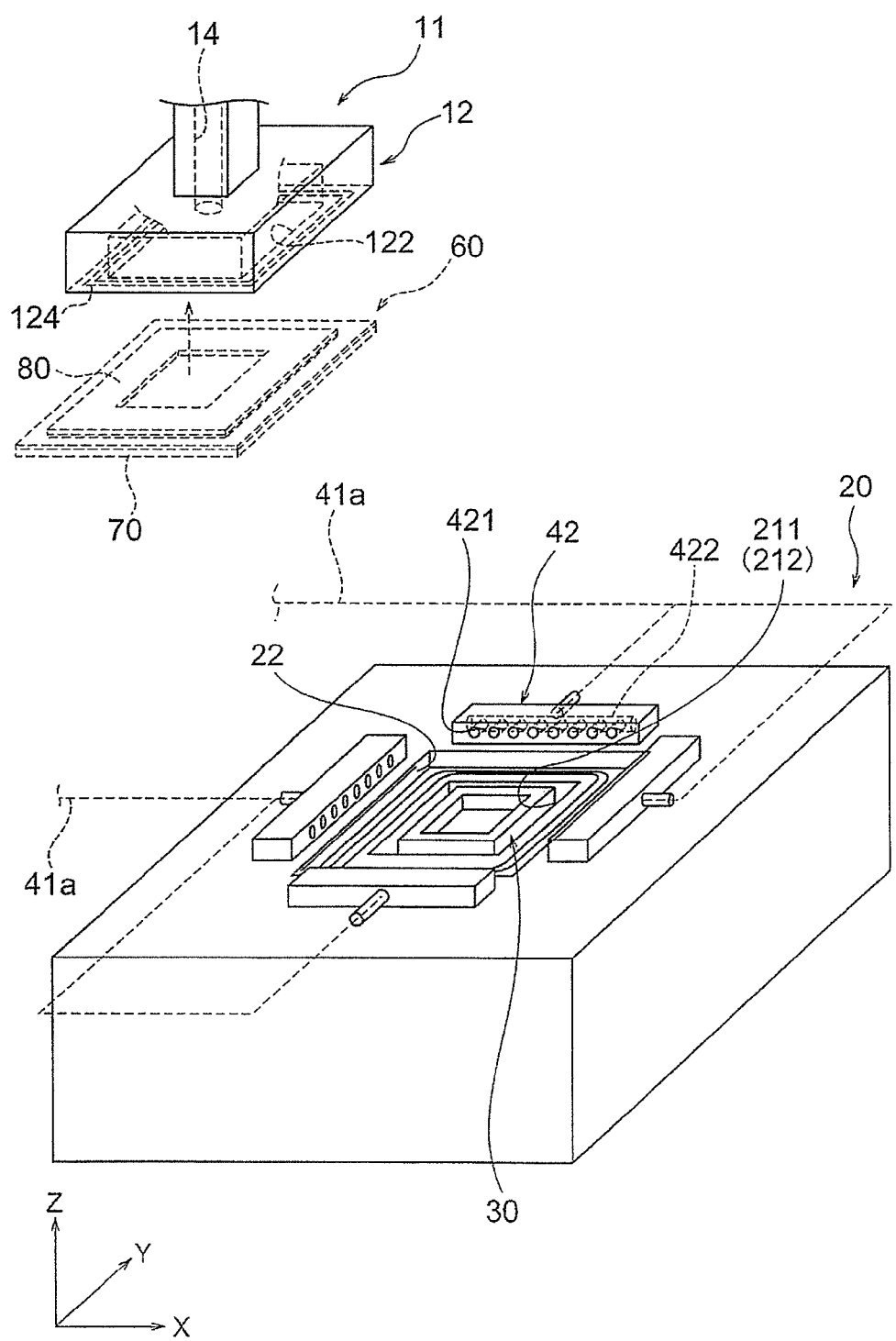
FIG. 8 is a perspective view illustrating a holding head and a holding table in the first embodiment of the present invention.
Figure 9:
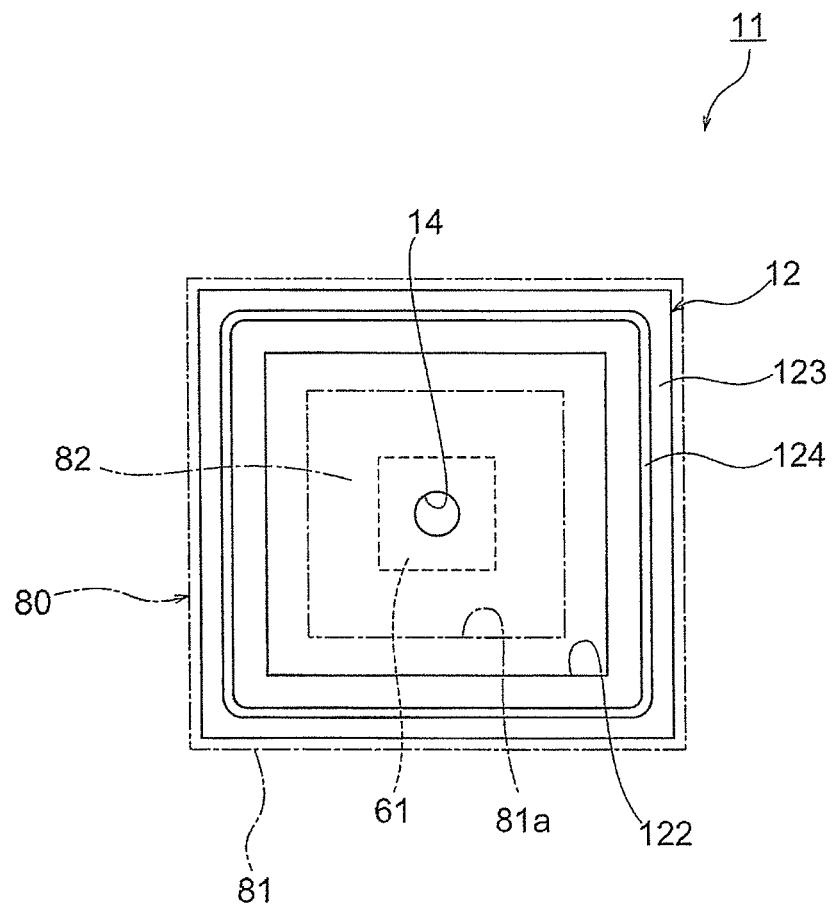
FIG. 9 is a bottom view illustrating the holding head in the first embodiment of the present invention.
Figure 10:
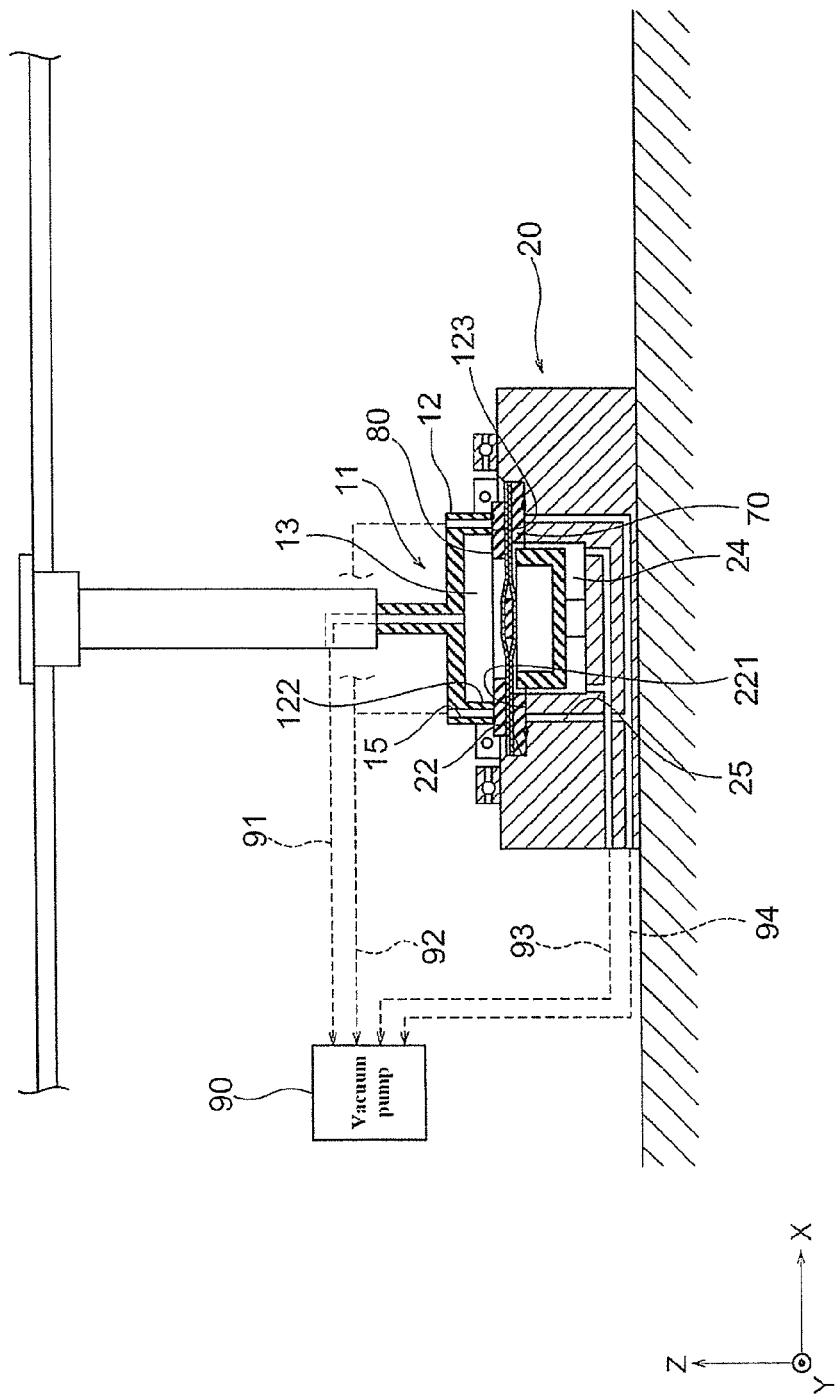
FIG. 10 is a cross-sectional view illustrating modified examples of the holding head and the holding table in the first embodiment of the present invention.
Figure 11:
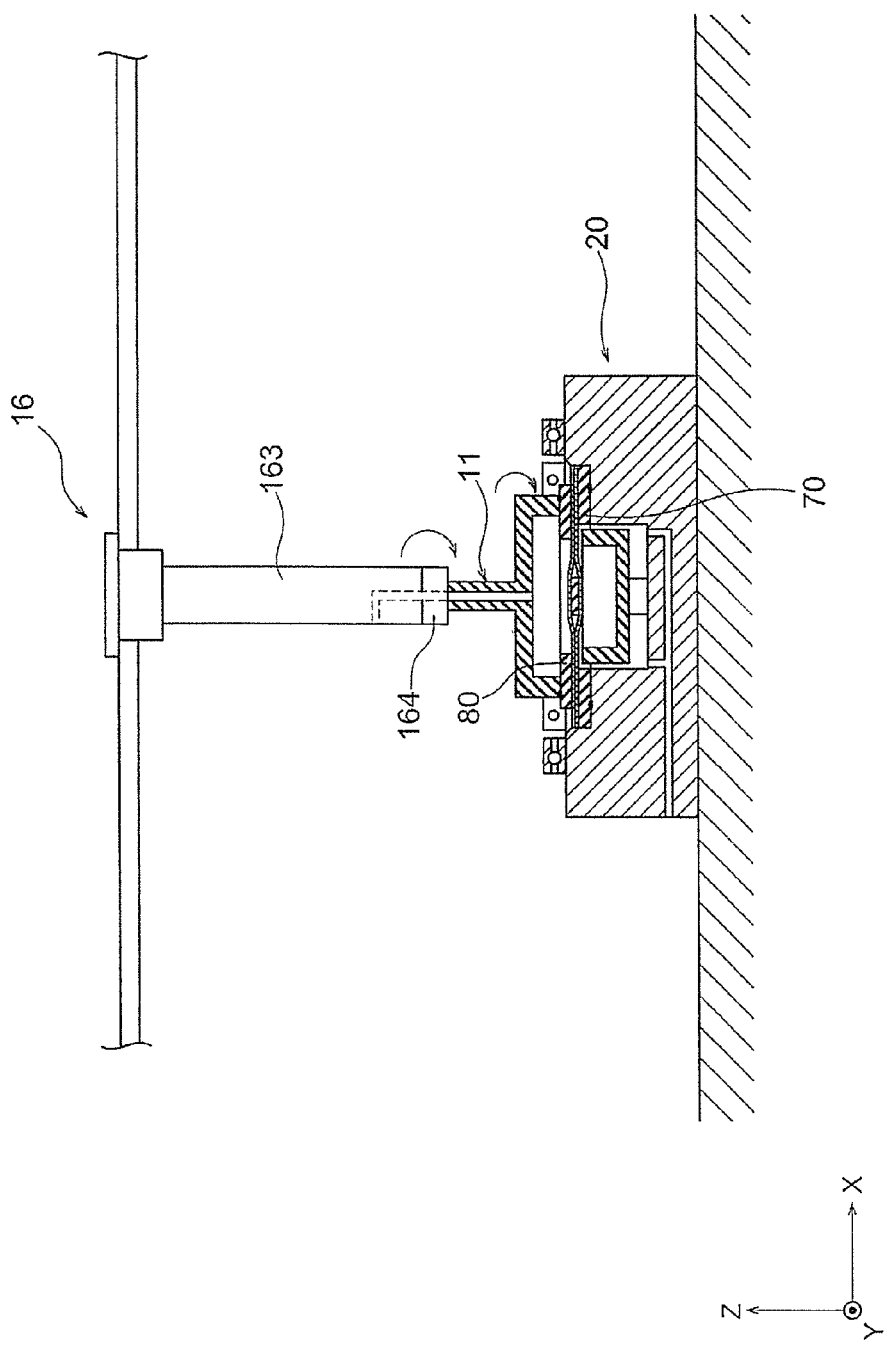
FIG. 11 is a cross-sectional view illustrating a modified example of a first carrier arm according to the first embodiment of the present invention.
Figure 12:
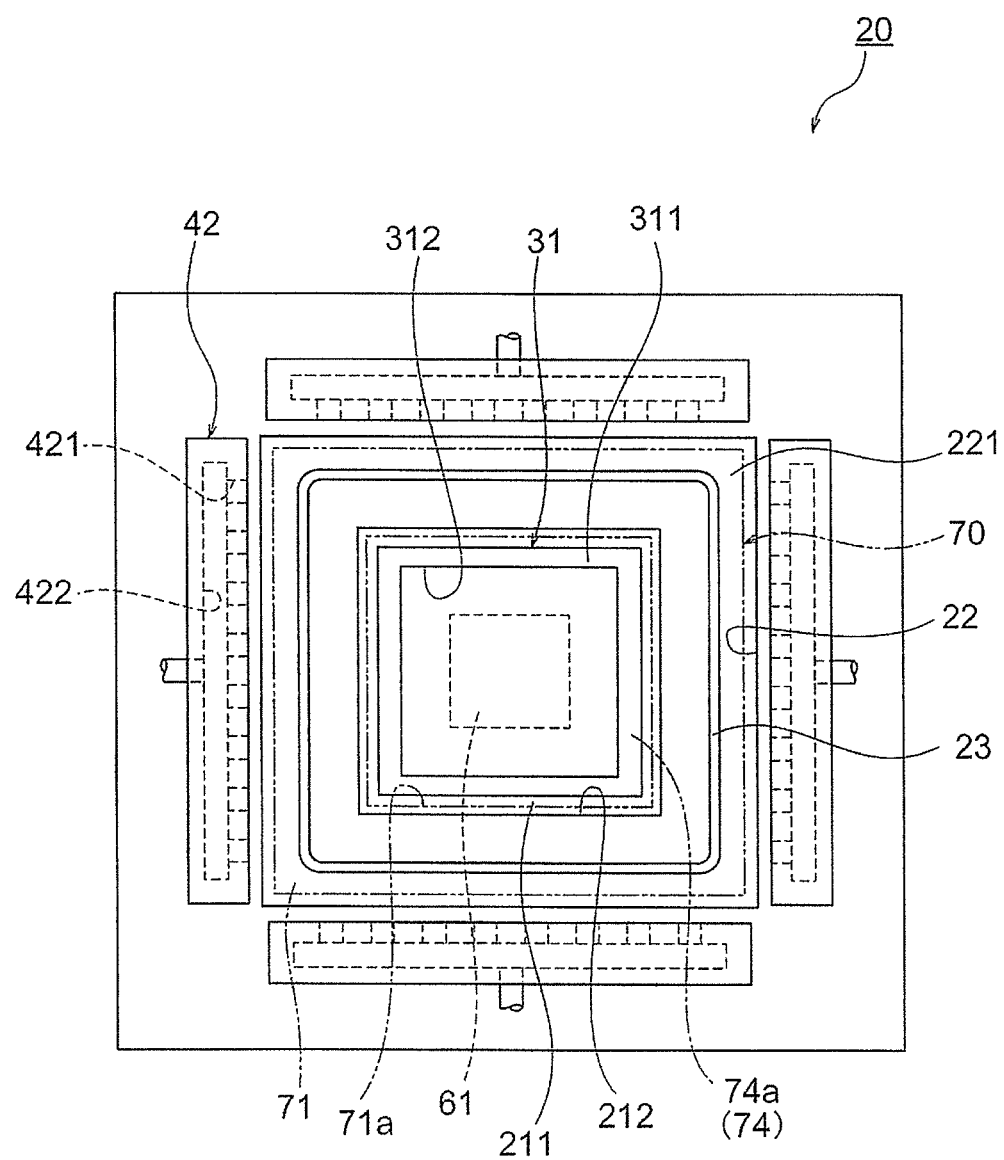
FIG. 12 is a plan view illustrating the holding table in the first embodiment of the present invention.
Figure 13:
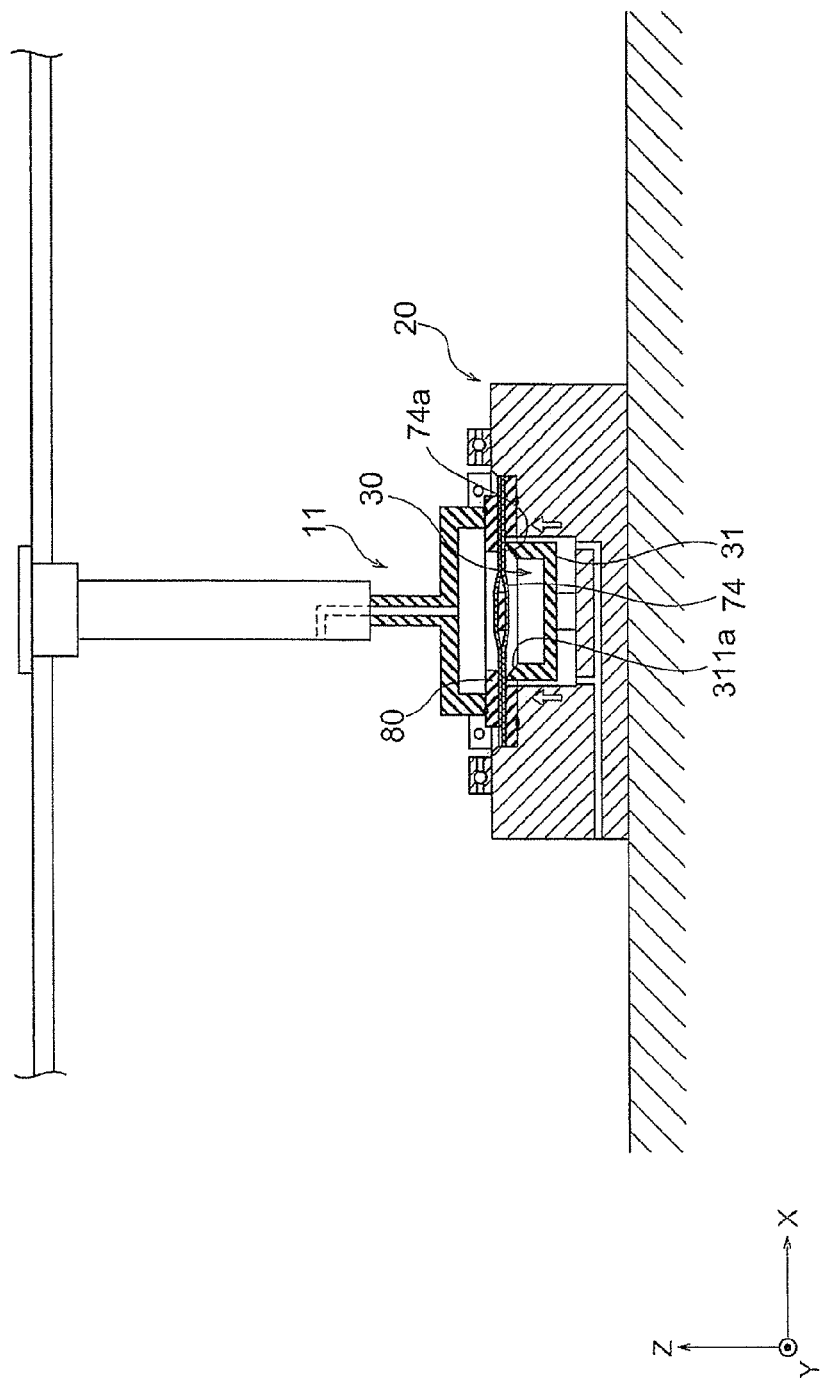
FIG. 13 is a cross-sectional view illustrating a first modified example of a pressing apparatus according to the first embodiment of the present invention.
Figure 14:
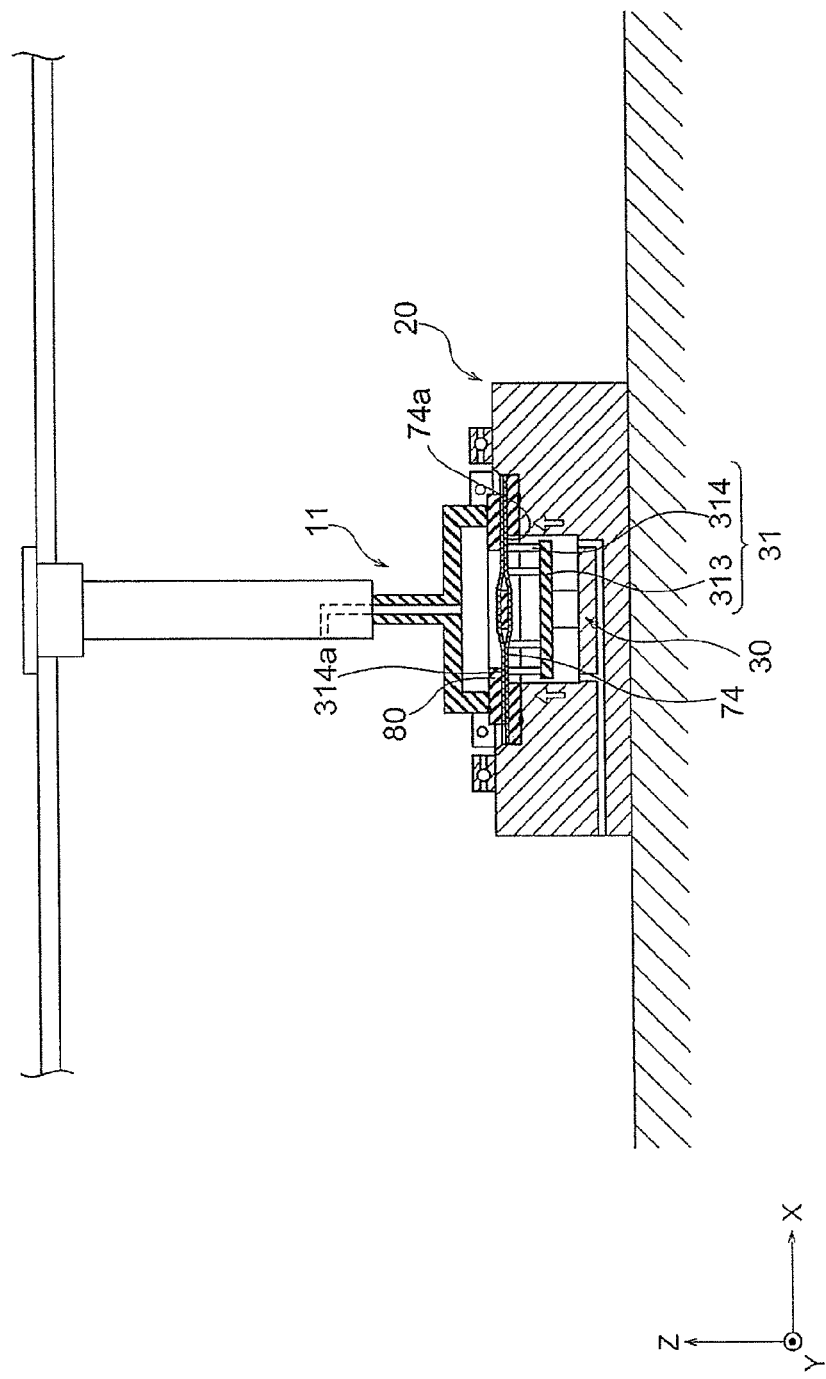
FIG. 14 is a cross-sectional view illustrating a second modified example of a pressing apparatus according to the first embodiment of the present invention.
Figure 15:
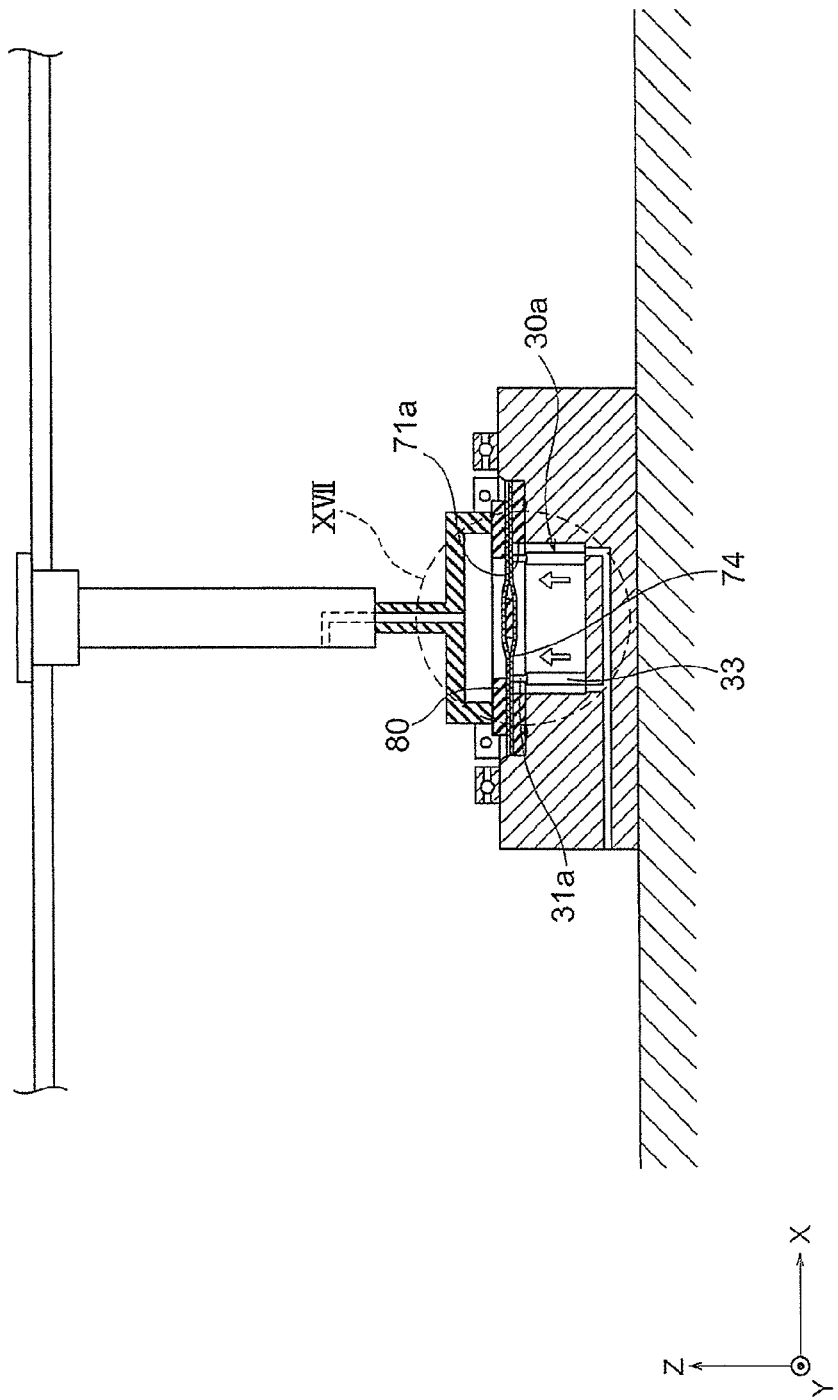
FIG. 15 is a cross-sectional view illustrating a third modified example of a pressing apparatus according to the first embodiment of the present invention.
Figure 16:
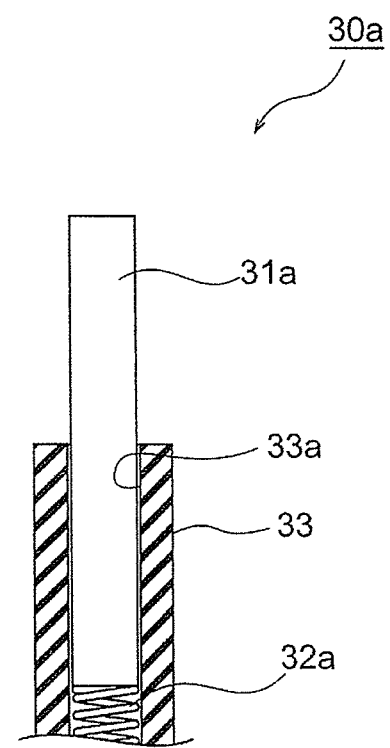
FIG. 16 is an enlarged cross-sectional view illustrating the third modified example of the pressing apparatus according to the first embodiment of the present invention.
Figure 17:
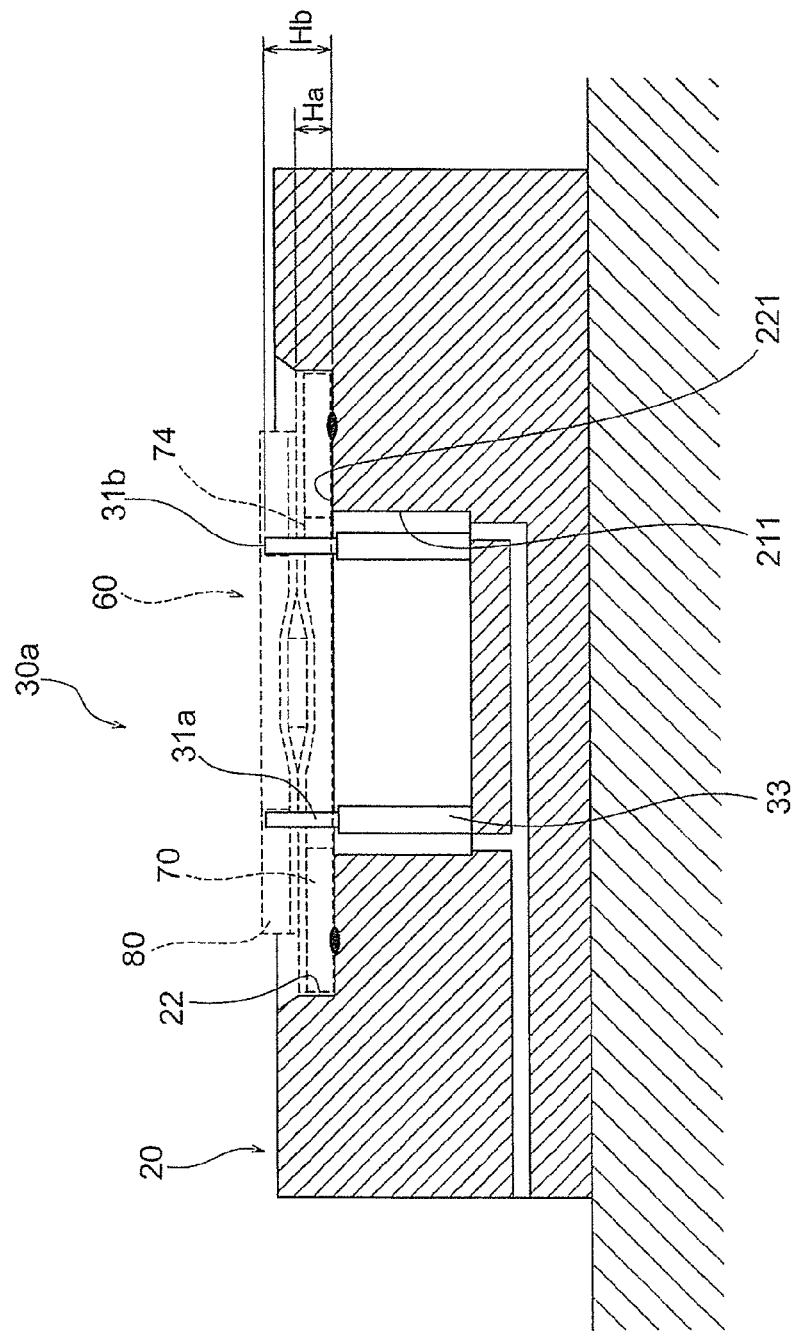
FIG. 17 is an enlarged cross-sectional view illustrating the part XVII of FIG. 15.
Figure 18:
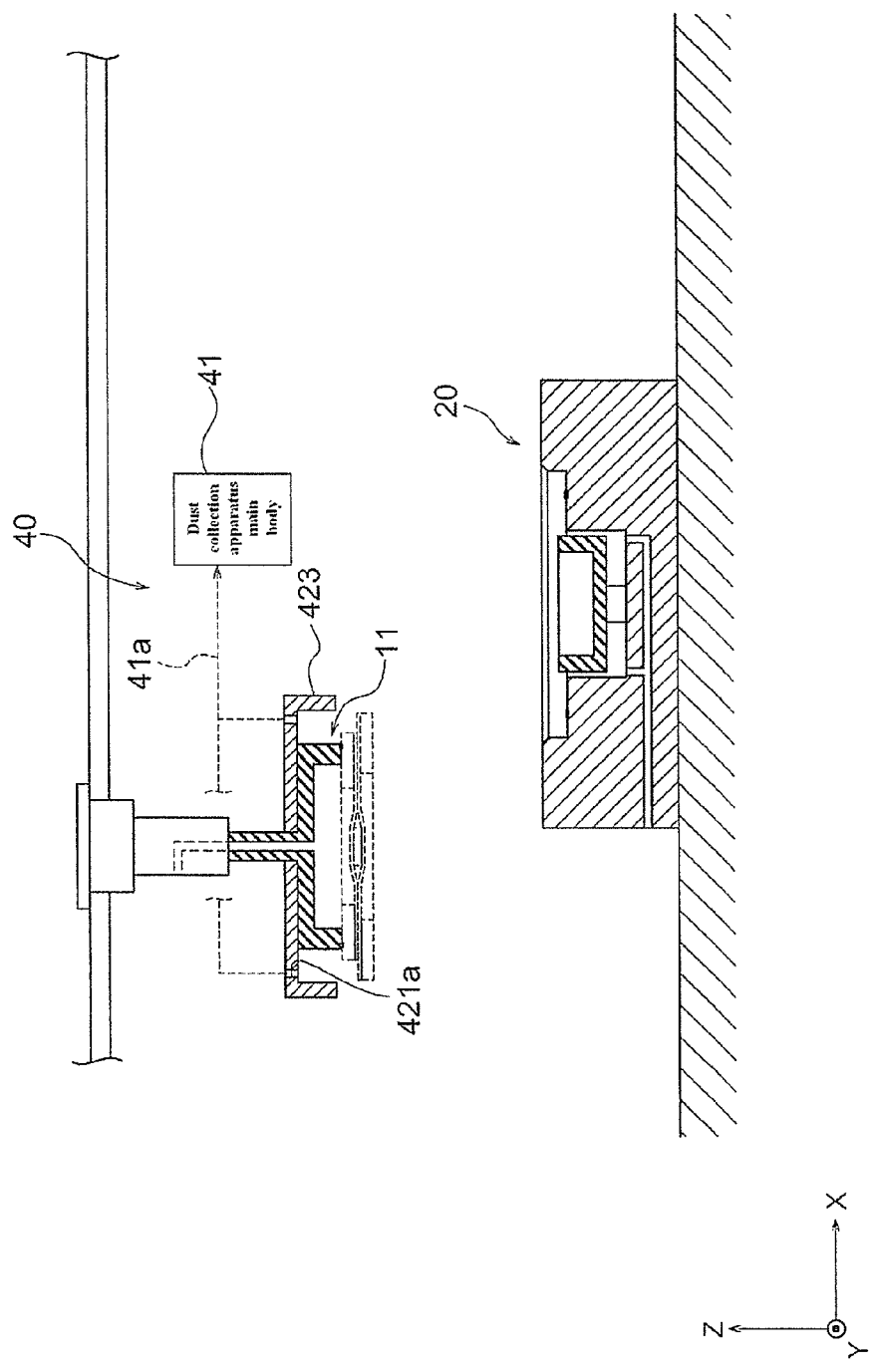
FIG. 18 is a cross-sectional view illustrating a modified example of a dust collection apparatus according to the first embodiment of the present invention.

FIG. 6 is a plan view illustrating the entire configuration of the carrier disassembling apparatus according to the present embodiment, FIG. 7 is a cross-sectional view along the line VII-VII of FIG. 6, FIG. 8 is a perspective view illustrating a holding head and a holding table in the present embodiment, FIG. 9 is a bottom view illustrating the holding head in the present embodiment, FIG. 10 is a cross-sectional view illustrating modified examples of the holding head and the holding table in the present embodiment, FIG. 11 is a cross-sectional view illustrating a modified example of a first carrier arm in the present embodiment, FIG. 12 is a plan view illustrating the holding table in the present embodiment, FIG. 13 to FIG. 15 are cross-sectional views illustrating first to third modified examples, respectively, of a pressing apparatus in the present embodiment, FIG. 16 is an enlarged cross-sectional view illustrating the third modified example of the pressing apparatus in the present embodiment, FIG. 17 is an enlarged cross-sectional view illustrating the part XVII of FIG. 15, and FIG. 18 is a cross-sectional view illustrating a modified example of a dust collection apparatus in the present embodiment.

The carrier disassembling apparatus 1 according to the present embodiment is an apparatus which, in order to take out the die 61 from the carrier for test 60 completed to be tested, disassembles the carrier for test 60 into the base member 70 and the cover member 80 and takes out the die 61 from the carrier for test 60.

This carrier disassembling apparatus 1 comprises, as shown in FIG. 6 and FIG. 7, a carrier moving part 10, a holding table 20, a pressing apparatus 30, a dust collection apparatus 40, and a taking out part 50.

The carrier moving part 10 receives a carrier for test 60 from a carrier supply part 10a to carry it to the holding table 20, and disassembles the carrier for test 60 in association with the holding table 20. Moreover, the carrier moving part 10 carries the cover member 80 having been separated from the carrier for test 60 to a stocker 17.

This carrier moving part 10 has a holding head 11 that holds the cover member 80, and a first carrier arm 16 that cause the holding head 11 to move three-dimensionally.

The holding head 11 has, as shown in FIG. 7 and FIG. 8, a first closing member 12 to form a first closed space 13 with the cover member 80. Note that the first closing member 12 in the present embodiment represents one example of the first closing means in the present invention.

This first closing member 12 is of pipe shape with bottom and formed therein with an opening 122. According to the present embodiment, this opening 122 is covered by the cover member 80 thereby to form the first closed space 13. Note that the opening 122 in the present embodiment represents one example of the first opening in the present invention.

Here, at the top end 123 of the first closing member 12 in the present embodiment, as shown in FIG. 7 to FIG. 9, a seal member 124 is provided around entire circumference of the first closing member 12 thereby to ensure that the first closing member 12 and the cover member 80 come to be close contact with each other. Note that specific examples of this seal member 124 include a packing, an O-ring and the like.

In addition, at the inner surface of this first closing member 12, a suction hole 14 connected with a vacuum pump 90 via a first suction line 91 is opened. Therefore, the vacuum pump 90 is enabled to reduce the pressure within the first closed space 13 formed by the first closing member 12 and the cover member 80. If the vacuum pump 90 reduces the pressure within the first closed space 13, then the cover member 80 is allowed to be adsorbed and held by the holding head 11.

While, in the present embodiment, the cover member 80 is thus caused to be held by the holding head 11 using the reduced pressure within the first closed space 13, in addition to this, as shown in FIG. 10, adsorb holes 15 may be formed at the top end 123 of the first closing member 12 so as to connect with the vacuum pump 90 via a second suction line 92 thereby adsorbing and holding the upper surface of the cover member 80 therethrough.

Here, the first closing member 12 in the present embodiment, as shown in the plan view (bottom plan view) of FIG. 9, is of a rectangular shape corresponding to the shape of the cover member 80 such that the top end 123 of the first closing member 12 is allowed to contact with the cover member 80 along the outer edge thereof. Moreover, the opening 122 of the first closing member 12 according to the present embodiment is formed as being larger than the die 61 and corresponds to the center opening 81a of the rigid plate 81. Therefore, if the vacuum pump 90 reduces the pressure within the first closed space 13, then, in the carrier for test 60, the pressure difference becomes to be low, and the pressure difference is pressure between the inside space (the accommodating space 60a (refer to FIG. 22)) and the outside space (the first closed space 13) of the film-like member 82 exposed via the center opening 81a.

The first carrier arm 16 has, as shown in FIG. 6 and FIG. 7, X-direction rails 161 provided along X-direction in the drawings, a Y-direction rail 162 movable along X-direction on the X-direction rails 161, and a Z-direction actuator 163 attached to the lower portion of the Y-direction rail 162 and movable along Y-direction. To this Z-direction actuator 163, the holding head 11 is attached. Accordingly, the first carrier arm 16 allows the carrier for test 60 to move three-dimensionally via the holding head 11.

Moreover, according to the present embodiment, the Z-direction actuator 163 separates the cover member 80 and the base member 70 from each other by causing the holding head 11 holding the cover member 80 to move upward and set apart relatively from the holding table 20 holding the base member 70. Note that the first carrier arm 16 in the present embodiment represents one example of the separating means in the present invention.

In addition, as shown in FIG. 11, a rotation actuator 164 rotatable around Z-direction as an axis may be provided between the Z-direction actuator 163 and the holding head 11. In this case, the cover member 80 may be separated from the base member 70 while driving the rotation actuator 164 to rotate (twist) the cover member 80 (the holding head 11) relatively to the base member 70 (the holding table 20). Similarly, not particularly illustrated, a rotation actuator may alternatively be attached to the lower portion of the holding table 20 to rotate (twist) the base member 70 relatively to the cover member 80. Note that the rotation actuator 164 in the present embodiment represents one example of the rotation means in the present invention.

The holding table 20 holds the base member 70 thereby to disassemble the carrier for test 60 in association with the carrier moving part 10.

This holding table 20 has, as shown in FIG. 7, a second closing member 21 that forms a second closed space 24 (refer to FIG. 22) in association with the base member 70. Note that the second closing member 21 in the present embodiment represents one example of the second closing means in the present invention.

As shown in FIG. 7, this second closing member 21 is of a recessed shape to have a recessed portion 211 formed with an opening 212. According to the present embodiment, this opening 212 is covered by the base member 70 thereby to form the second closed space 24 (refer to FIG. 22). Note that the opening 212 in the present embodiment represents one example of the second opening in the present invention.

Here, the holding table 20 in the present embodiment is provided with an accommodating part 22 above the recessed portion 211, and accommodating part 22 is capable of accommodating the base member 70. At the bottom surface of the accommodating part 22, as shown in FIG. 7 and FIG. 12, a seal member 23 is provided around the entire circumference thereby to ensure that the holding table 20 and the base member 70 come to be close contact with each other. Note that specific examples of this seal member 23 include a packing, an O-ring and the like.

In addition, the accommodating part 22 in the present embodiment is of a recessed portion, though not particularly limited. For example, the upper surface of the holding table 20 may alternatively be provided thereon with pins or ribs in accordance with the outer shape of the base member 70 thereby to define an accommodating part.

Furthermore, at the bottom surface 213 of this recessed portion 211, suction holes 214 connected with the vacuum pump 90 via a third suction line 93 are opened. That is, the recessed portion 211 of the second closing member 21 is connected with the vacuum pump 90, and the vacuum pump 90 is thus capable of reducing the pressure within the second closed space 24 (refer to FIG. 22) formed by the recessed portion 211 and the base member 70. If the vacuum pump 90 reduces the pressure within the second closed space 24, then the base member 70 is allowed to be adsorbed and held by the holding table 20.

Although, in the present embodiment, the base member 70 is thus caused to be held on the holding table 20 by using the reduced pressure within the second closed space 24 (refer to FIG. 22), in addition to this, as shown in FIG. 10, adsorption holes 25 may be formed at the bottom surface 221 of the accommodating part 22 of the holding table 20 so as to connect with the vacuum pump 90 via a fourth suction line 94 thereby adsorbing the lower surface of the base member 70 therethrough.

Moreover, as shown in FIG. 12, according to the present embodiment, the opening 212 of the recessed portion 211 is formed as being larger than the die 61 and corresponds to the center opening 71a of the rigid plate 71. Therefore, if the vacuum pump 90 reduces the pressure within the second closed space 24, then the pressure difference becomes to be low, the pressure difference is pressure between the inside space (the accommodating space 60a) and the outside space (the second closed space 24) of the film-like member 74 exposed via the center opening 71a (refer to FIG. 22).

Here, in the present embodiment, although one vacuum pump 90 reduces the pressure within both the first closed space 13 and the second closed space 24, the present invention is not particularly limited to this. For example, there may alternatively be provided separately a vacuum pump to reduce the pressure within the first closed space 13 and another vacuum pump to reduce the pressure within the second closed space 24. Note that the vacuum pump 90 represents one example of the first and second decompression means in the present invention.

Figure 22:
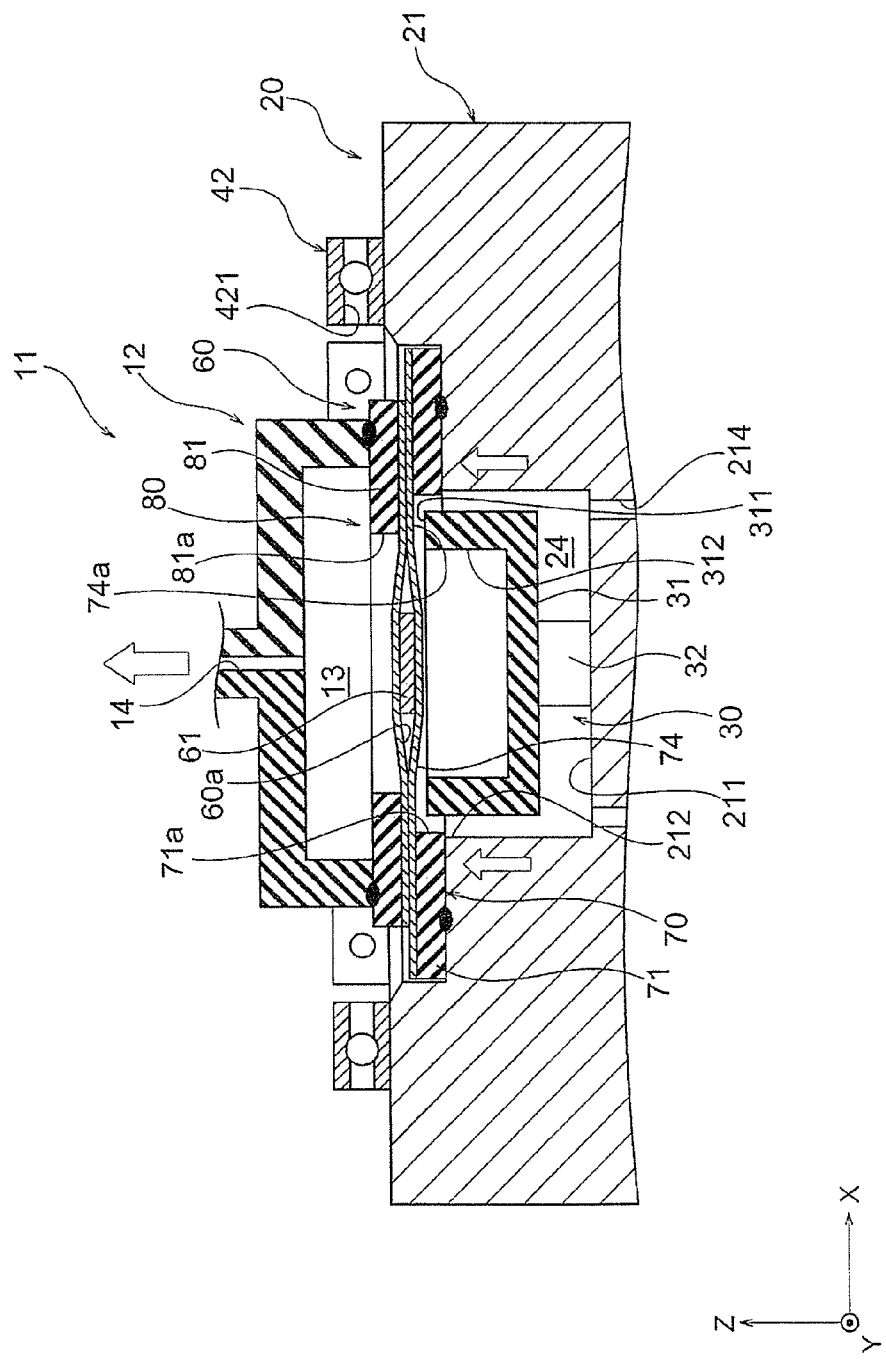
FIG. 22 is an enlarged cross-sectional view of the part XXII of FIG. 21.

The pressing apparatus 30 presses the cover member 80 via the center opening 71a of the base member 70 (refer to FIG. 22). According to the present embodiment, the pressing force by the pressing apparatus 30 triggers the cover member 80 to be separated from the base member 70.

The pressing apparatus 30, which is accommodated in the recessed portion 211 of the holding table 20 as shown in FIG. 7, has a contact member 31 and a Z-direction actuator 32.

The contact member 31 has, as shown in FIG. 7 and FIG. 12, a contact plane 311 at the top end thereof, and the contact plane 311 surface contacts with an exposed area 74a (refer to FIG. 22) of the film-like member 74 exposed through the center opening 71a. Moreover, a recessed portion 312 is formed at the center area of the contact plane 311. Accordingly, when the contact plane 311 surface contacts with the exposed area 74a, the contact member 31 and the die 61 are prevented from interfering with each other thereby to suppress damages of the die 61.

Figure 21:
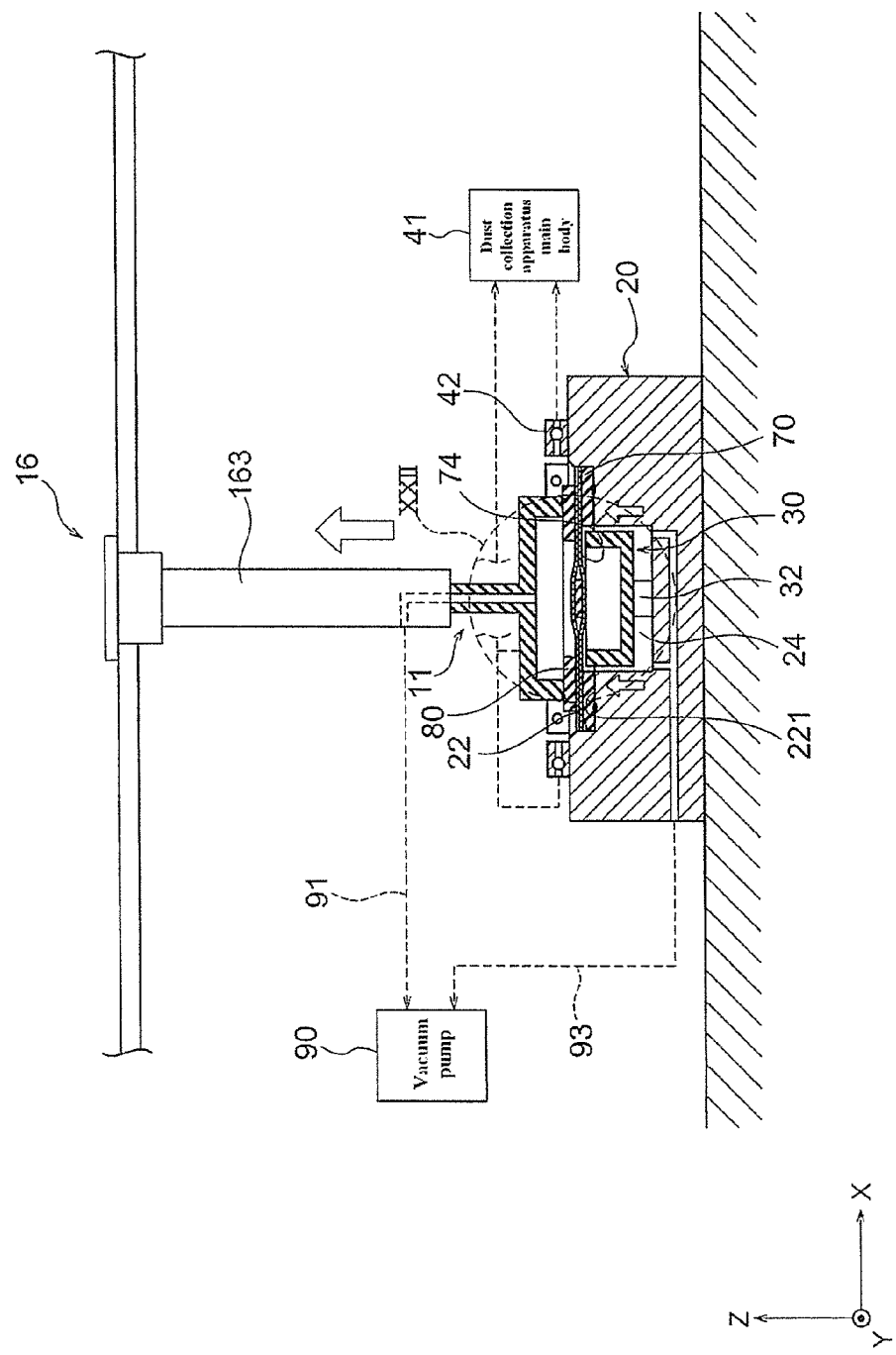
FIG. 21 is a cross-sectional view (part two) illustrating the operation of the carrier disassembling apparatus according to the first embodiment of the present invention.

The Z-direction actuator 32, which is an apparatus causing the contact member 31 to move in Z-direction, allows the contact member 31 to move upward and downward relative to the film-like member 74 of the base member 70 accommodated in the accommodating part 22 (refer to FIG. 21). As shown in FIG. 7, the lower end of the Z-direction actuator 32 in the present embodiment is fixed to the bottom surface 213 of the recessed portion 211 and the upper end of the Z-direction actuator 32 is fixed to the lower end of the contact member 31. Note that the Z-direction actuator 32 in the present embodiment represents one example of the moving means.

Here, in the present embodiment, although the contact member 31 is configured so as to surface contact with the film-like member 74, the present invention is not particularly limited to this.

For example, as shown in FIG. 13, a contact plane 311a may be inclined such that the upper end of the contact plane 311a contacts with the exposed area 74a substantially in line-contact manner. Note that, in this case, the upper end of the contact plane 311a represents one example of the contact portion in the present invention.

Moreover, as shown in FIG. 14, the contact member 31 may be comprised of a plate-like member 313 and pins 314 provided on the plate-like member 313, thereby causing the top ends 314a of the pins 314 to contact with the exposed area 74a each substantially in point-contact manner. Note that, in this case, the top ends 314a of the pins 314 represent one example of the contact portion in the present invention.

Alternatively, as shown in FIG. 15 and FIG. 16, the pressing apparatus 30a may be comprised of contact members 31a, biasing members 32a, and guide members 33.

In the pressing apparatus 30a, the contact members 31a are guided toward the film-like member 74 by guide holes 33a of the guide members 33 while being biased by the biasing members 32a. Note that, in the present embodiment, each biasing member 32a is configured as a coil-like spring, but not particularly limited to this, and each biasing member 32a may be configured as a plate-like spring or rubber. Also note that the biasing members 32a in the present embodiment represent one example of the biasing means in the present invention.

Furthermore, in the present embodiment, as shown in FIG. 17, the height is Ha from the bottom surface 221 of the accommodating part 22 to the lower surface of the film-like member 74 in the status where the carrier for test 60 is accommodated in the accommodating part 22 of the holding table 20. On the other hand, the contact members 31a are provided such that the height comes to be Hb from the bottom surface 221 of the accommodating part 22 to the top ends 31b of the contact members 31a, and the height Hb is thus larger than the height Ha (Ha<Hb) in the present embodiment. This allows the cover member 80 to be pressed to the contact members 31a at the time of accommodating the base member 70 into the accommodating part 22, and therefore a power source, such as a Z-direction actuator, is unnecessary to press the cover member 80. Consequently, the carrier disassembling apparatus 1 may be provided at low cost.

Thus, the carrier disassembling apparatus 1 according to the present embodiment is provided with the pressing apparatus 30, 30a, but the present invention is not particularly limited to this. For example, if the contact status between the base member 70 and the cover member 80 is relatively weak, then, without providing the pressing apparatus 30, 30a, the cover member 80 and the base member 70 may alternatively be separated from each other by the first carrier arm 16 causing the holding head 11 to move upward.

The dust collection apparatus 40 has, as shown in FIG. 7, a dust collection apparatus main body 41 and blocks 42. This dust collection apparatus main body 41 is connected with the blocks 42 via dust collection suction lines 41a.

As shown in FIG. 7 and FIG. 8, the blocks 42 are arranged around the accommodating part 22 of the holding table 20. These blocks 42 are formed therein with suction holes 421 opened toward the accommodating part 22, and connecting paths 422 connecting the suction holes 421 with the dust collection suction lines 41a. Therefore, during the disassembling of the carrier for test 60, the dust collection apparatus main body 41 is capable of operating to suction the dusts (e.g. originated from the adhesive agent 741 for the adhesion between the base member 70 and the cover member 80) via these suction holes 421. This may suppress the dusts from attaching to the die 61 after the carrier for test 60 has been disassembled.

Moreover, in the present embodiment, the suction holes 421 (blocks 42) are arranged around the accommodating part 22, and the dusts between the base member 70 and the cover member 80 may thus be removed at the time of the disassembling of the cover member 80 from the base member 70. This may further suppress the dusts from attaching to the die 61.

Although, in the present embodiment, the blocks 42 are provided, the present invention is not particularly limited to this. For example, as shown in FIG. 18, the holding head 11 may alternatively be covered by a dust collection cover 423, which is attached to the holding head 11 and formed therein with suction holes 421a to connect with the dust collection suction lines 41a. Attaching the dust collection cover 423 in this manner allows the dusts to be easily introduced into the suction holes 421a.

As shown in FIG. 6, the taking out part 50 has a second carrier arm 51 and a third carrier arm 52.

The second carrier arm 51 picks up the die 61 from the carrier for test 60 having been disassembled and carries the die 61 to an empty tray (not shown) incorporated in the stocker 53. This second carrier arm 51 has Y-direction rails 511 provided along Y-direction in the drawing, an X-direction rail 512 movable along Y-direction on the Y-direction rails 511, and a Z-direction actuator 513 attached to the lower portion of the X-direction rail 512 and movable along X-direction. To this Z-direction actuator 513, a suction pad (not shown) capable of adsorbing the die 61 is attached. Accordingly, the second carrier arm 51 allows the die 61 to move three-dimensionally via the suction pad.

The third carrier arm 52 picks up the base member 70 from the carrier for test 60 having been disassembled and carries the base member 70 to an empty tray (not shown) incorporated in the stocker 54. This third carrier arm 52 has Y-direction rails 521 provided along Y-direction in the drawing, an X-direction rail 522 movable along Y-direction on the Y-direction rails 521, and a Z-direction actuator 523 attached to the lower portion of the X-direction rail 522 and movable along X-direction. To this Z-direction actuator 523, a suction pad (not shown) capable of adsorbing the base member 70 is attached. Accordingly, the third carrier arm 52 allows the base member 70 to move three-dimensionally via the suction pad.

As described above, according to the present embodiment, the carrier moving part 10 is caused to receive the carrier for test 60 to carry it to the holding table 20, and disassemble the carrier for test 60 in association with the holding table 20, thereby capable of carrying the cover member 80 having been separated from the carrier for test 60 to the stocker 17, but the present invention is not particularly limited to this. For example, there may alternatively be provided separately a carrier carrying part to receive a carrier for test and carry it to a holding table, a disassembling part to disassemble the carrier for test in association with the holding table, and a cover carrying part to carry the cover member to a stocker.

Subsequently, the disassembling method of carrier for test according to the present embodiment will be described with reference to FIG. 19 to FIG. 22.

Figure 19:
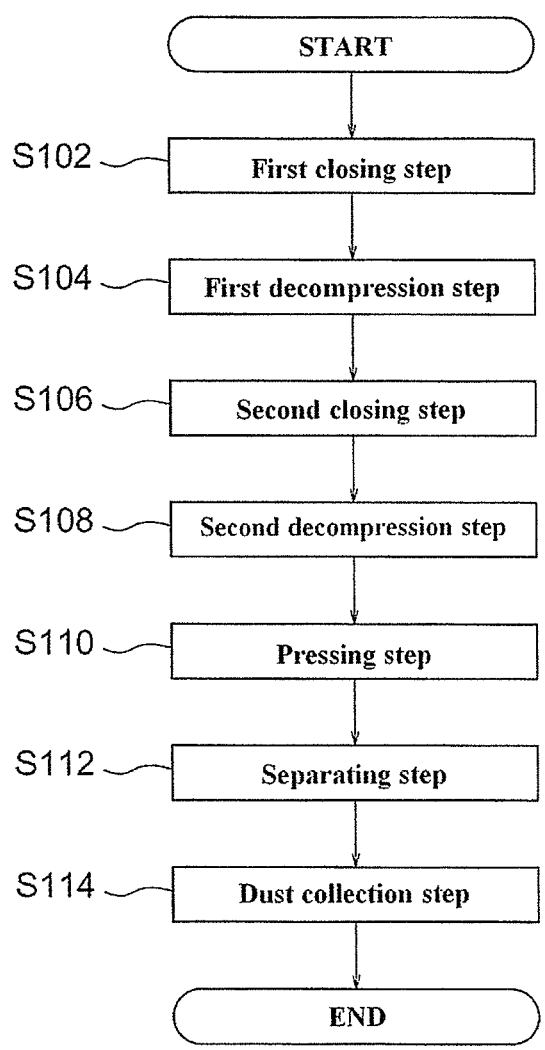
FIG. 19 is a flowchart illustrating the disassembling step in FIG. 1.
Figure 20:
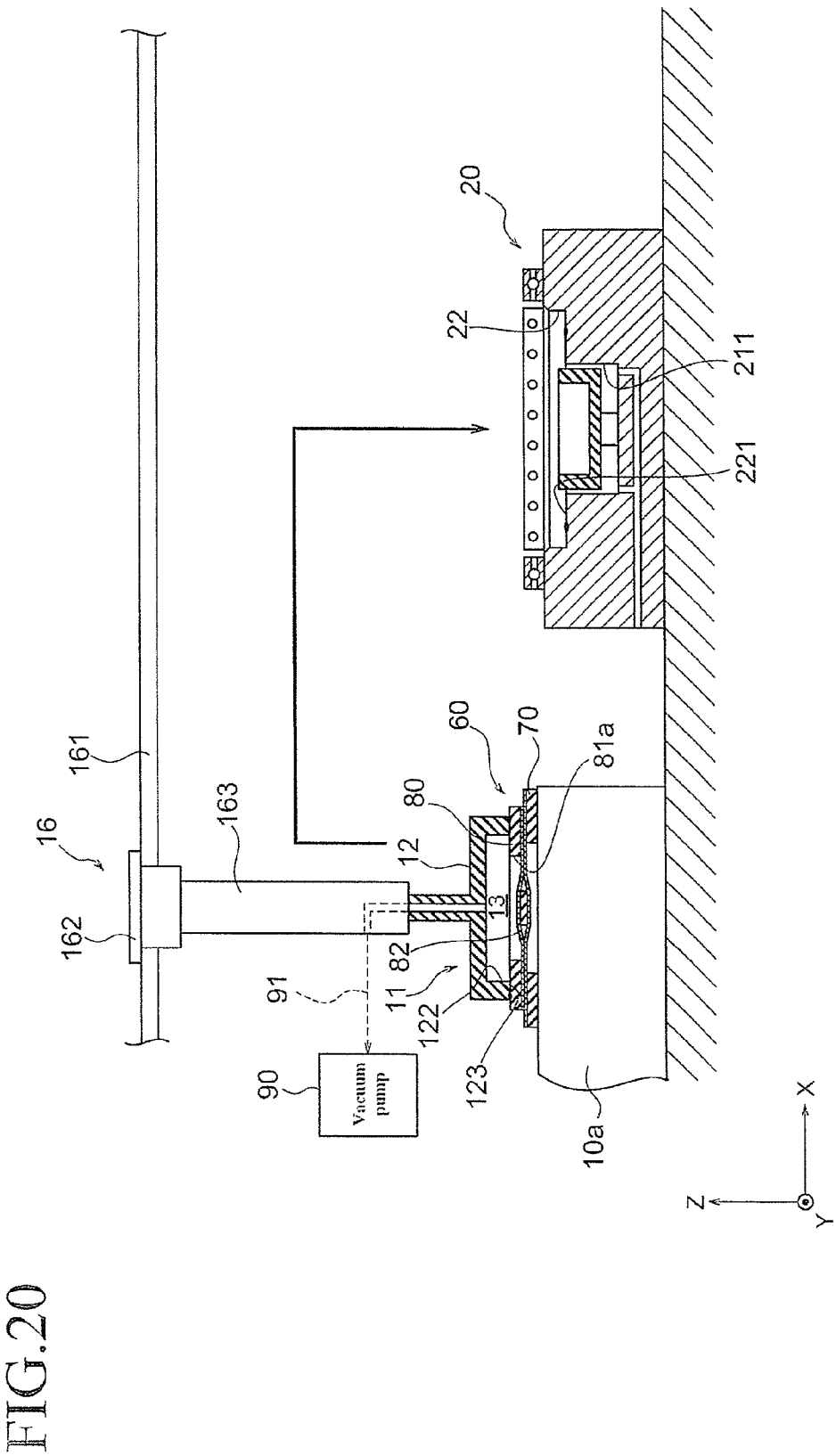
FIG. 20 is a cross-sectional view (part one) illustrating the operation of the carrier disassembling apparatus according to the first embodiment of the present invention.

FIG. 19 is a flowchart illustrating the disassembling step in FIG. 1, FIG. 20 and FIG. 21 are cross-sectional views illustrating the operation of the carrier disassembling apparatus according to the present embodiment, and FIG. 22 is an enlarged cross-sectional view of the part XXII of FIG. 21.

As shown in FIG. 19, the carrier disassembling method according to the present embodiment comprises a first closing step S102, a first decompression step S104, a second closing step S106, a second decompression step S108, a pressing step S110, a separating step S112, and a dust collection step S114.

In the first closing step S102, as shown in FIG. 20, the first carrier arm 16 initially causes the holding head 11 to move to above the carrier for test 60 within the carrier supply part 10a such that the top end 123 of the holding head 11 comes close contact with the cover member 80 of the carrier for test 60. This allows the opening 122 of the holding head 11 to be closed with the cover member 80 thereby forming the first closed space 13.

In the first decompression step S104, the vacuum pump 90 then reduces the pressure within the first closed space 13 to a lower pressure than the external air (atmospheric pressure). This allows the cover member 80 to be adsorbed and held by the holding head 11.

Thereafter, in the second closing step S106, the first carrier arm 16 carries, using the holding head 11, the carrier for test 60 from the carrier supply part 10a to the accommodating part 22 of the holding table 20. When the base member 70 is placed on the bottom surface 221 of the accommodating part 22, they come to close contact with each other, thereby to form the second closed space 24 (refer to FIG. 22).

Subsequently, in the second decompression step S108, as shown in FIG. 21 and FIG. 22, the vacuum pump 90 reduces the pressure within the second closed space 24 to a lower pressure than the external air (atmospheric pressure). This allows the base member 70 to be adsorbed and held by the holding table 20.

Moreover, because the situation is obtained where the carrier for test 60 intervenes between the decompressed first closed space 13 and the decompressed second closed space 24, the pressure difference between the outside of the carrier for test 60 and the inside thereof (accommodating space 60a) is offset (reduced) thereby weakening the close contact between the base member 70 and the cover member 80. This allows the first carrier arm 16 to easily separate the cover member 80 from the base member 70.

Thereafter, in the pressing step S110, as shown in FIG. 21 and FIG. 22, the pressing apparatus 30 presses the cover member 80 through the center opening 71a of the base member 70.

More specifically, the Z-direction actuator 32 of the pressing apparatus 30 causes the contact member 31 to move upward. This causes the contact member 31 to move forward into the center opening 71a of the base member 70 and allows the contact plane 311 to contact with the exposed area 74a of the film-like member 74 in a surface contact manner, thereby pressing the rigid plate 81 of the cover member 80 via the film-like member 74.

Here, according to the present embodiment, the film-like member 74 of the base member 70 has certain flexibility, and the pressing force by the pressing apparatus 30 is thus transmitted mainly to the cover member 80. Furthermore, because the base member 70 is adsorbed and held by the holding table 20, the cover member 80 receiving that pressing force tends to move relatively away from the base member 70. Therefore, if the pressing apparatus 30 presses the cover member 80, then it comes to be a trigger for separating the cover member 80 from the base member 70.

Note that this pressing step S110 may be performed prior to the separating step S112 or substantially at the same time with the separating step S112.

Subsequently, in the separating step S112, as shown in FIG. 21, the Z-direction actuator 163 of the first carrier arm 16 causes the holding head 11 holding the cover member 80 to move upward and to depart relatively from the holding table 20, which still holds the base member 70. This allows the cover member 80 and the base member 70 to separate from each other.

Note that, in the separating step S112, as shown in FIG. 11, at the time of causing the holding head 11 to depart relatively from the holding table 20, the rotation actuator 164 may be used for rotating the cover member 80 (holding head 11) relatively to the base member 70 (holding table 20) around Z-direction as an axis.

Thereafter, in the dust collection step S114, the dust collection apparatus 40 is caused to collect the dusts arising from the separating of the cover member 80 and the base member 70. This may suppress the dusts from attaching to the die 61 exposed from the cover member 80 during the separating step S112. Note that the dust collection step S114 is performed at least concurrently with the separating step S112.

The first carrier arm 16 then carries the cover member 80 to an empty tray within the stocker 17 using the holding head 11, as shown in FIG. 6. Likewise, the second carrier arm 51 causes the suction pad to adsorb and hold the die 61 and carries the die 61 to an empty tray within the stocker 53. The vacuum pump 90 then releases the decompression within the second closed space 24 thereby enabling the base member 70 to be carried.

Thereafter, the third carrier arm 52 causes the suction pad to adsorb and hold the base member 70 to carry it to an empty tray within the stocker 54.

Note that the present embodiment involves, as shown in FIG. 19, the first closing step S102, the first decompression step S104, the second closing step S106, and the second decompression step S108 in this order, but the order thereof is not particularly limited. For example, there may alternatively be performed the second closing step S106, the second decompression step S108, the first closing step S102, and the first decompression step S104 in this order.

Moreover, the present embodiment involves the pressing step S110, but the present invention is not particularly limited to this. For example, the pressing step S110 may not be necessary if there is no adhesive agent between the base member 70 and the cover member 80 and the contact status therebetween may thus be relatively weak, or if the pressure difference between the pressure within the accommodating space 60a and the atmospheric pressure is low and the contact status between the base member 70 and the cover member 80 may also be relatively weak, or other case.

As described hereinbefore, according to the present embodiment, the vacuum pump 90 reduces the pressure within the first closed space 13 and also reduces the pressure within the second closed space 24 thereby to facilitate the separating of the base member 70 and the cover member 80.

Particularly, the carrier for test 60 according to the present embodiment is configured such that the space (accommodating space 60a) between the base member 70 and the cover member 80 may be decompressed relatively to the external air, and therefore the die 61 is allowed to be held by the base member 70 and the cover member 80 due to the pressure difference between the inside space (decompressed accommodating space 60a) of the carrier for test 60 and the outside space (atmospheric pressure). For the carrier for test 60 with such a configuration, the present embodiment provides the status where both outsides of the carrier for test 60 face the respective closed spaces 13 and 24, and these closed spaces 13 and 14 are decompressed to a lower pressure than the atmospheric pressure in order to reduce or cancel the pressure difference between the inside and the outside of the carrier for test 60, thereby allowing the carrier for test 60 to easily be disassembled.

Moreover, the present embodiment provides the status where the carrier for test 60 intervenes between the decompressed first closed space 13 and the decompressed second closed space 24 at the time of disassembling the carrier for test 60, and therefore the base member 70 and the cover member 80 are enabled to more easily be separated.

Furthermore, according to the present embodiment, the opening 122 of the holding head 11 and the opening 212 of the holding table 20 are formed larger than the die 61. Specifically, the opening 122 of the holding head 11 corresponds to the center opening 81a of the cover member 80, while the opening 212 of the holding table 20 corresponds to the center opening 71a of the base member 70. Therefore, if the vacuum pump 90 reduces the pressure within the closed spaces 13 and 24, then the film-like members 74 and 82 come entirely to be easily separated at where the film-like members 74 and 82 are exposed through the center openings 71a and 81a of the rigid plates 71 and 81, thereby to release the holding of the die 61.

In addition to this, according to the present embodiment, the pressing apparatus 30 presses the rigid plate 81 of the cover member 80 through the center opening 71a of the base member 70. Therefore, the pressing force by the pressing apparatus 30 triggers the base member 70 and the cover member 80 to be steadily separated from each other.

Moreover, according to the present embodiment, the carrier for test 60 may be disassembled without causing any external force to act on the die 61, thereby to suppress the die 61 from being damaged.

Furthermore, the present embodiment enables the carrier for test 60 to be disassembled without machining it, and therefore the base member 70 and/or the cover member 80 may be readily to be recycled. Particularly, since the rigid plates 71 and 81 are relatively expensive compared to the film-like members 74 and 82, recycling them allows the carrier for test 60 to be provided at low cost.

In addition, according to the present embodiment, it is unnecessary to preliminarily form notches and the like to the carrier for test 60 for disassembling the carrier for test 60, and the carrier for test 60 is thus suppressed from being expensive.

Hereinafter, the second embodiment will be described.

Second Embodiment

Figure 23:
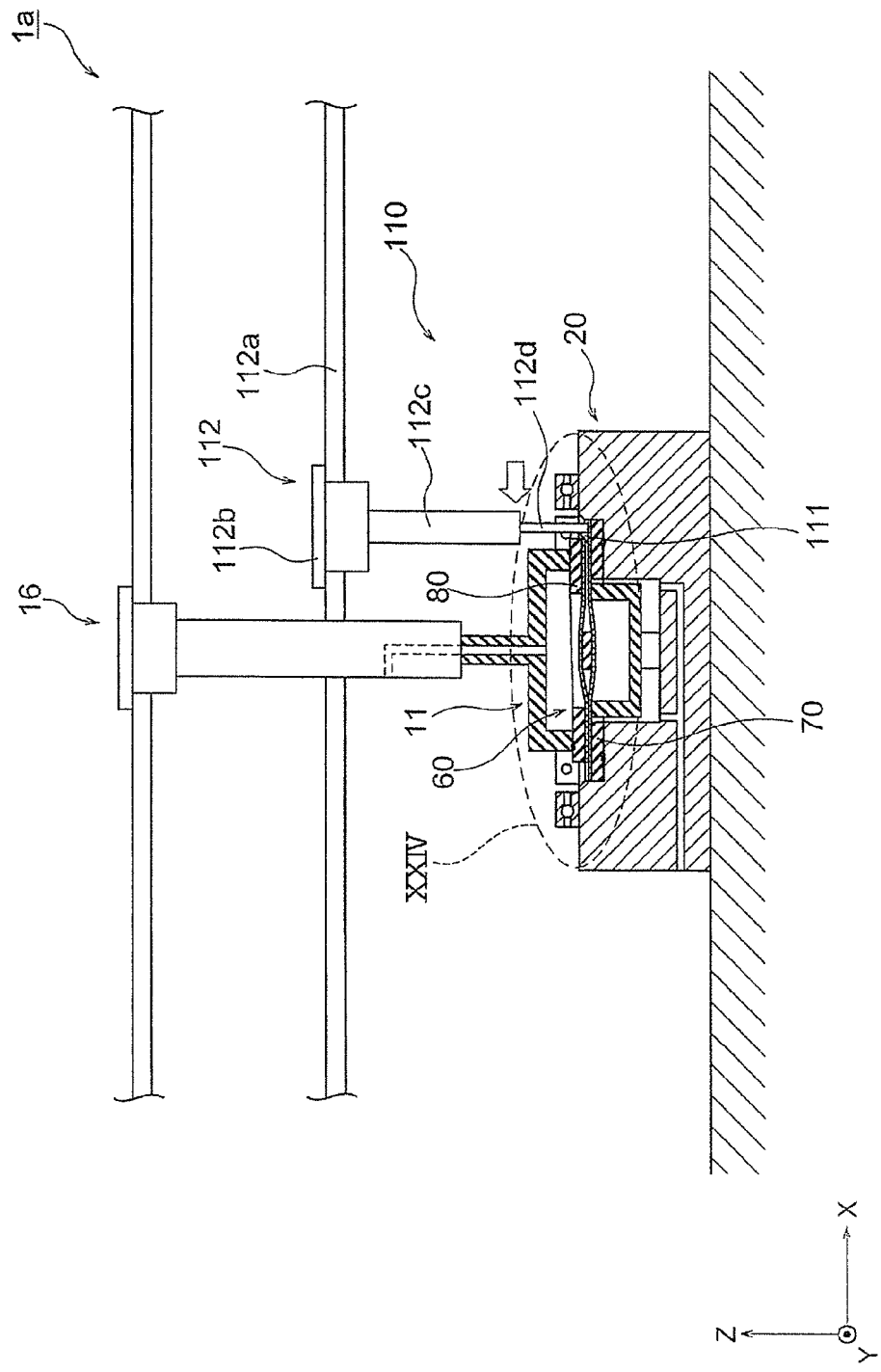
FIG. 23 is a cross-sectional view illustrating a carrier disassembling apparatus according to a second embodiment of the present invention.
Figure 24:
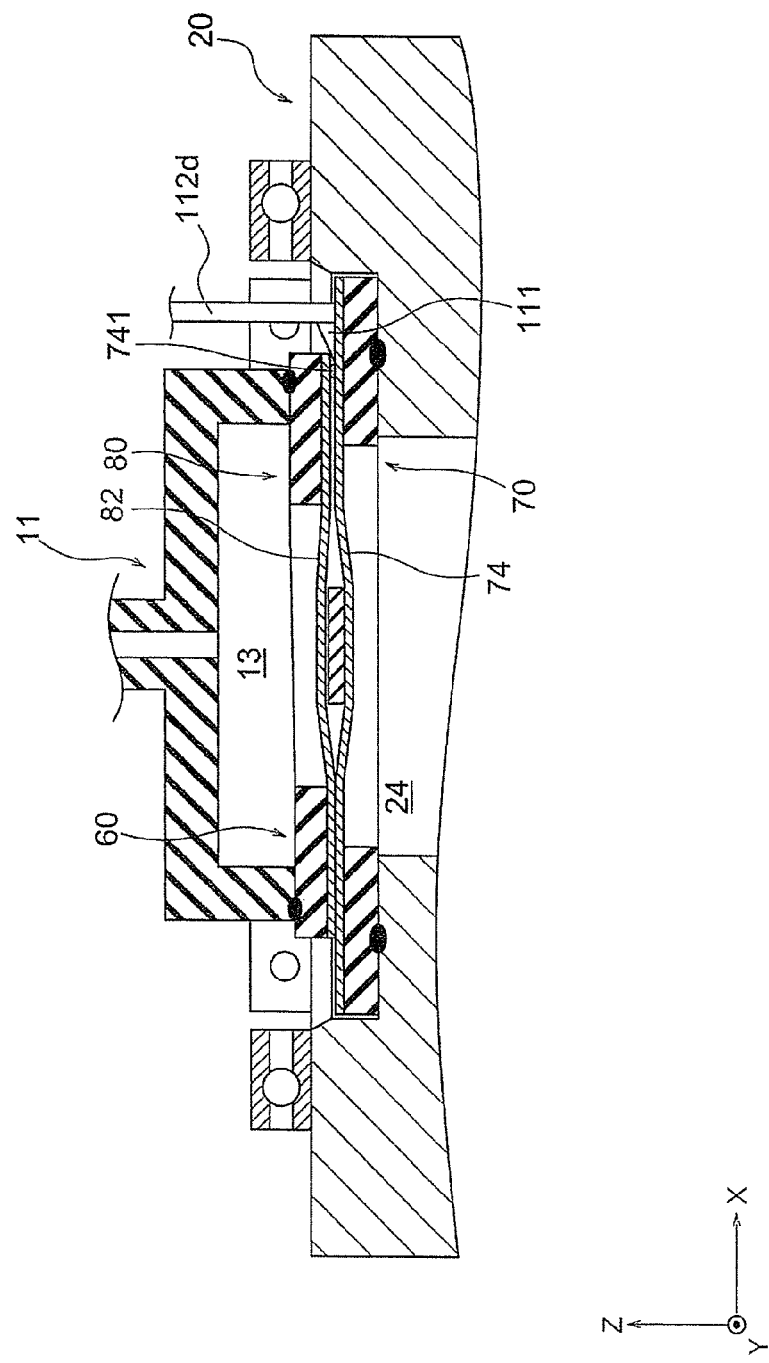
FIG. 24 is an enlarged cross-sectional view of the part XXIV of FIG. 23.
Figure 26:
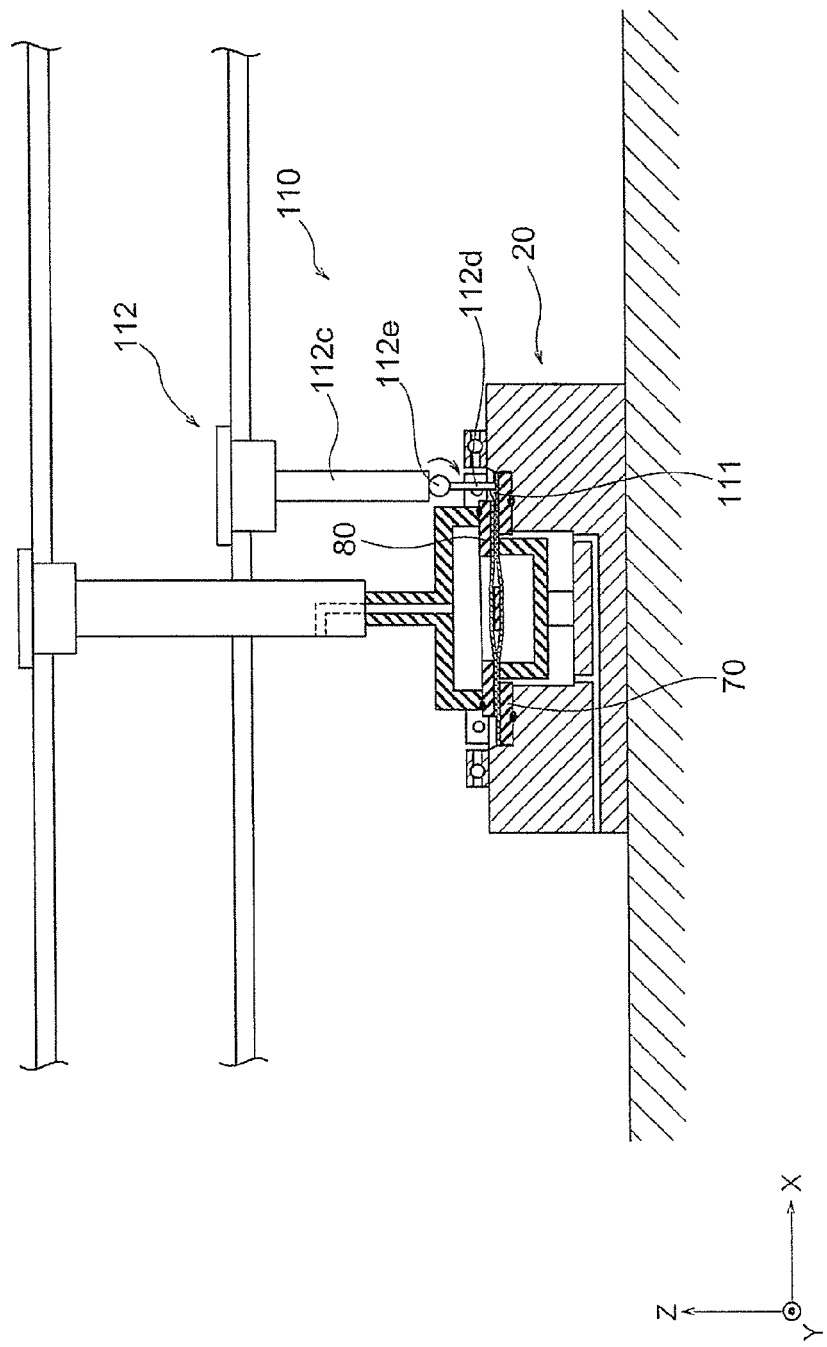
FIG. 26 is a cross-sectional view illustrating a first modified example of the carrier disassembling apparatus according to the second embodiment of the present invention.
Figure 27:
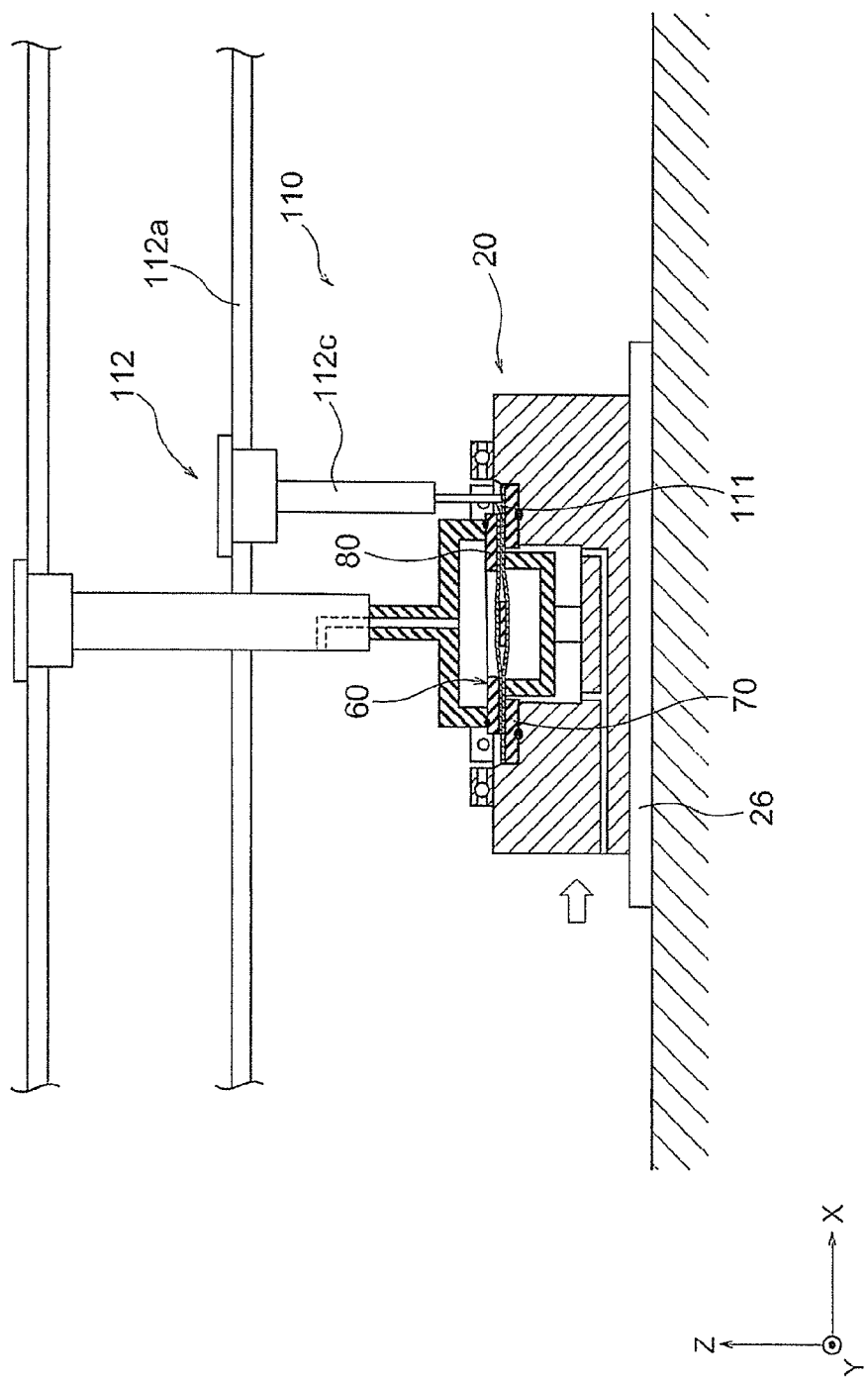
FIG. 27 is a cross-sectional view illustrating a second modified example of the carrier disassembling apparatus according to the second embodiment of the present invention.

FIG. 23 is a cross-sectional view illustrating a carrier disassembling apparatus according to the present embodiment, FIG. 24 is an enlarged cross-sectional view of the part XXIV of FIG. 23, and FIG. 26 and FIG. 27 are cross-sectional views illustrating modified examples of the carrier disassembling apparatus according to the present embodiment.

While the present embodiment differs from the first embodiment in that a carrier disassembling apparatus 1a further comprises an insertion apparatus 110, the remaining configuration is similar to the first embodiment. Hereinafter, the difference from the first embodiment will only be described, and components having similar configuration as the first embodiment will be omitted to be described by denoting the same reference numerals. Note that, in the present embodiment, whether the pressing apparatus 30, 30a is present or absent is not particularly limited, likewise the first embodiment.

The insertion apparatus 110 in the present embodiment has, as shown in FIG. 23 and FIG. 24, a plate-like member 111 and a moving arm 112. Note that the insertion apparatus 110 in the present embodiment represents one example of insertion means in the present invention.

The plate-like member 111 is a member to be inserted between the base member 70 and the cover member 80. This plate-like member 111 is formed in a shape, such as a knife, a paddle, or the like, which is capable of edging into a relatively narrow gap. Note that, in the present embodiment, the top end of the plate-like member 111 is formed at a sharp angle, the present invention is not particularly limited to this.

The moving arm 112 has X-direction rails 112a provided along X-direction in FIG. 23, a Y-direction supporting member 112b movable along X-direction on the X-direction rails 112a, and a Z-direction actuator 112c attached to the Y-direction supporting member 112b. The top end of this Z-direction actuator 112c is attached thereto with the plate-like member 111 via a shaft 112d. Therefore, this moving arm 112 is capable of causing the plate-like member 111 to move in X-direction and Z-direction via the shaft 112d.

The carrier disassembling method according to the present embodiment will now be described.

Figure 25:
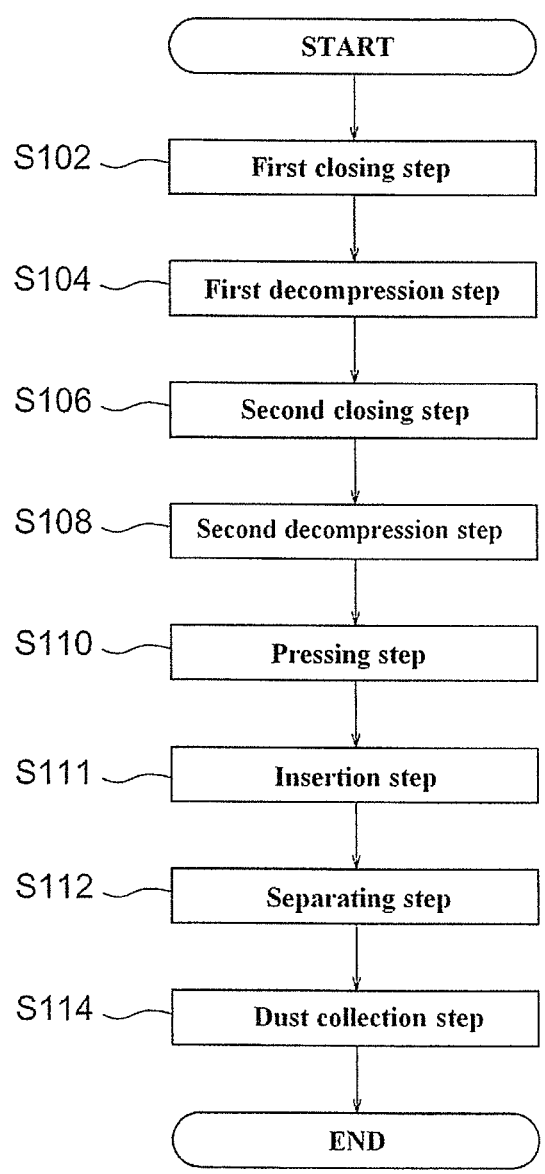
FIG. 25 is a flowchart illustrating the carrier disassembling method according to the second embodiment of the present invention.

FIG. 25 is a flowchart illustrating the carrier disassembling method according to the present embodiment.

While the present embodiment differs from the first embodiment in that the carrier disassembling method according to the present embodiment further comprises an insertion step S111, as shown in FIG. 25, other steps are similar to those in the first embodiment. Hereinafter, the difference from the first embodiment will only be described, and steps similar to the first embodiment will be omitted to be described by denoting the same reference numerals. Note that, in the present embodiment, whether the pressing step S110 is present or absent is not particularly limited, likewise the first embodiment.

The insertion step S111 is performed after the second decompression step S108 as shown in FIG. 19, and before the separating step S112 or at the same time with the separating step S112.

More specifically, the moving arm 112 initially causes the plate-like member 111 to move onto the base member 70 having been held by the holding table 20 in the second decompression step S108. The Y-direction supporting member 112b is then caused to move on the X-direction rails 112a of the moving arm 112 such that the top end of the plate-like member 111 is inserted between the base member 70 and the cover member 80. This allows the outer peripheral area of the cover member 80 to be detached from the base member 70, as shown in FIG. 23 and FIG. 24. Note that, in the case where the base member 70 and the cover member 80 adhere with each other by the adhesive agent 741, the plate-like member 111 may be caused to break the hardened adhesive agent 741.

This allows the cover member 80 to be easily separated from the base member 70 in the separating step S112.

Moreover, in the status where the plate-like member 111 is inserted between the base member 70 and the cover member 80, the Z-direction actuator 112c may possibly be caused to move upward in order for the cover member 80 to be detached from the base member 70.

Alternatively, as shown in FIG. 26, a rotation actuator 112e may be provided between the Z-direction actuator 112c and the shaft 112d for rotating the plate-like member 111 around Y-direction as an axis. In this case, in the status where the plate-like member 111 is inserted between the base member 70 and the cover member 80, the plate-like member 111 is caused to rotate toward the X-axis negative direction in the drawing, thereby detaching the cover member 80 from the base member 70.

Here, according to the present embodiment, while the moving arm 112 causes the plate-like member 111 to move such that the top end of the plate-like member 111 is inserted between the base member 70 and the cover member 80, the method for causing the plate-like member 111 to be inserted between the base member 70 and the cover member 80 is not particularly limited. For example, as shown in FIG. 27, the holding table 20 may alternatively be caused to move relatively toward the plate-like member 111. In this case, X-direction rails 26 are additionally provided at the lower portion of the holding table 20 in order for the holding table 20 to be movable along X-direction on the X-direction rails 26.

Furthermore, according to the present embodiment, but not particularly limited, the insertion step S111 is performed on the holding table 20, and therefore the carrier disassembling apparatus 1a may be provided at lower cost compared to the case where a table is additionally provided for a single purpose of holding the base member 70 to perform the insertion step S111.

The third embodiment will now be described.

Third Embodiment

Figure 28:
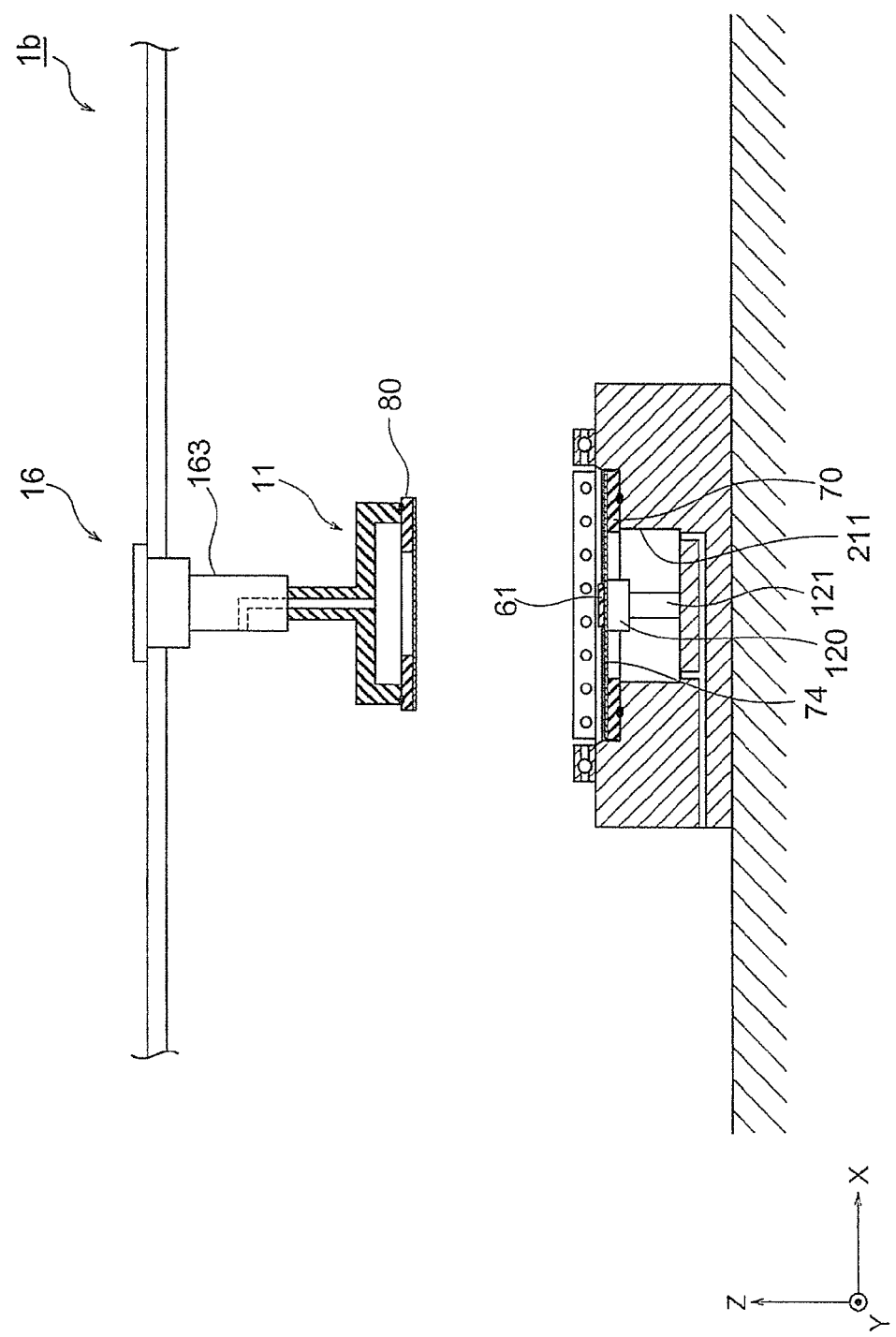
FIG. 28 is a cross-sectional view illustrating a carrier disassembling apparatus according to a third embodiment of the present invention.

FIG. 28 is a cross-sectional view illustrating a carrier disassembling apparatus according to the present embodiment.

While the present embodiment differs from the first embodiment in that a carrier disassembling apparatus 1b further comprises an electrostatic chuck 120, the remaining configuration is similar to the first embodiment. Note that the electrostatic chuck 120 in the present embodiment represents one example of the holding means in the present invention. Hereinafter, the difference from the first embodiment will only be described, and components having similar configuration as the first embodiment will be omitted to be described by denoting the same reference numerals. Note that, also in the present embodiment, whether the pressing apparatus 30, 30a is present or absent is not particularly limited, likewise the first embodiment. In addition, the carrier disassembling apparatus 1b according to the present embodiment may also comprise an insertion apparatus, likewise the second embodiment.

The electrostatic chuck 120 holds the die 61 during the disassembling of the carrier for test 60. As shown in FIG. 28, the electrostatic chuck 120 is accommodated in the recessed portion 211 of the holding table 20 in the status of being supported by a supporting member 121. This electrostatic chuck 120 is enabled to hold the die 61 via the base member 70 by using the Coulombic force or the Johnsen-Rahbek force. Note that the pressing apparatus is omitted to be illustrated in the same figure.

The carrier disassembling method according to the present embodiment will now be described.

Figure 29:
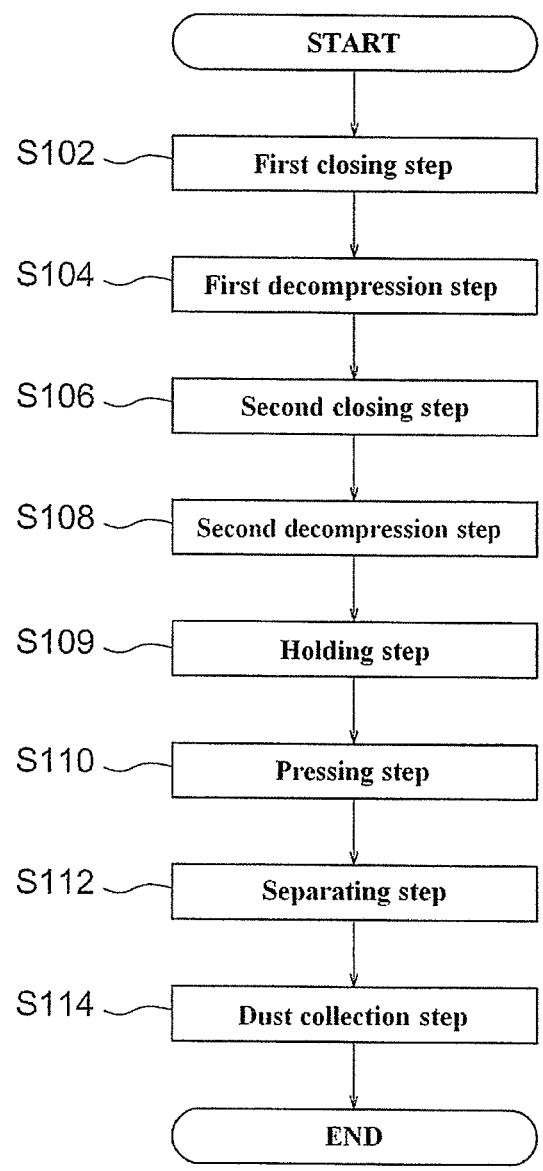
FIG. 29 is a flowchart illustrating the carrier disassembling method according to the third embodiment of the present invention.

FIG. 29 is a flowchart illustrating the carrier disassembling method according to the present embodiment.

While the present embodiment differs from the first embodiment in that the carrier disassembling method according to the present embodiment further comprises a holding step S109, as shown in FIG. 29, other steps are similar to those in the first embodiment. Hereinafter, the difference from the first embodiment will only be described, and steps similar to the first embodiment will be omitted to be described by denoting the same reference numerals. Note that, also in the present embodiment, whether the pressing step S110 is present or absent is not particularly limited, likewise the first embodiment. In addition, the carrier disassembling method according to the present embodiment may also comprise an insertion step, likewise the second embodiment.

In the holding step S109, at least during from before the separating step S112 to after the same, the electrostatic chuck 120 holds the die 61. For example, the electrostatic chuck 120 initiates the holding of the die 61 after the second decompression step S108, and releases the holding of the die 61 when the suction pad of the second carrier arm 51 adsorbs the die 61 after completing the separating step S112. That is, according to the present embodiment, while the electrostatic chuck 120 holds the die 61 via the base member 70, the first carrier arm 16 performs the separating step S112.

Accordingly, at the time of separating the cover member 80 from the base member 70, even if the base member 70 slightly moves, the die 61 is prevented from falling below the base member 70 and the damage of the die 61 may thus be avoided. In addition, holding the die 61 at a predetermined position allows the suction pad of the second carrier arm 51 to steadily adsorb the die 61 thereby to ensure the die 61 being carried.

It is to be noted that the embodiments as explained hereinbefore are described to facilitate understanding of the present invention and are not described to limit the present invention. Therefore, it is intended that the elements disclosed in the above embodiments include all design changes and equivalents to fall within the technical scope of the present invention.

DESCRIPTION OF REFERENCE NUMERALS 1, 1a, 1b . . . carrier disassembling apparatus
10 . . . carrier moving part
  11 . . . holding head
  12 . . . first closing member (first closing means)
    122 . . . opening (first opening)
  13 . . . first closed space
  16 . . . first carrier arm (separating means)
20 . . . holding table
  21 . . . second closing member (second closing means)
    211 . . . recessed portion
    212 . . . opening (second opening)
  22 . . . accommodating part
  24 . . . second closed space
30 . . . pressing apparatus (pressing means)
  31 . . . contact member
    311 . . . contact plane
40 . . . dust collection apparatus (dust collection means)
50 . . . taking out part
60 . . . carrier for test
  61 . . . die (electronic device)
70 . . . base member
  71 . . . rigid plate (second rigid plate)
  74 . . . film-like member
80 . . . cover member
  81 . . . rigid plate (first rigid plate)
  82 . . . film-like member
90 . . . vacuum pump
110 . . . insertion apparatus (insertion means)
  111 . . . plate-like member
120 . . . electrostatic chuck (holding means)

The invention claimed is:

1. A carrier disassembling apparatus for disassembling a carrier for test having a cover member and a base member between which an electronic device is nipped the carrier disassembling apparatus comprising:
  a holding head that holds the cover member;
  a first holding table that holds the base member; and
  a separator that causes the holding head to depart relatively from the first holding table to separate the cover member and the base member from each other,
  the holding head has a first closer that forms a first closed space between the holding head and the cover member,
  the first holding table has a second closer that forms a second closed space between the first holding table and the base member, and
  the carrier disassembling apparatus further comprises:
  a first decompressor that reduces pressure within the first closed space; and
  a second decompressor that reduces pressure within the second closed space.

2. The carrier disassembling apparatus as set forth in claim 1, wherein
  the electronic device is accommodated in an accommodating space between the cover member and the base member of the carrier for test, and the accommodating space is decompressed relative to an external air.

3. The carrier disassembling apparatus as set forth in claim 1, wherein
  the first closer has a pipe shape with bottom formed with a first opening larger than the electronic device,
  the closer has a recessed shape formed with a second opening larger than the electronic device,
  the first opening is to be covered by the cover member to form the first closed space, and
  the second opening is to be covered by the base member to form the second closed space.

4. The carrier disassembling apparatus as set forth in claim 3, further comprising a holder that is provided within the recessed shape of the second closer and holds the electronic device via the base member.

5. The carrier disassembling apparatus as set forth in claim 1, wherein the separator separates the cover member and the base member of the carrier for test from each other, and the carrier for test is intervening between the first closed space decompressed and the second closed space decompressed.

6. The carrier disassembling apparatus as set forth in claim 1, wherein the separator has a rotator that rotates the holding head relative to the first holding table.

7. The carrier disassembling apparatus as set forth in claim 1, wherein
the cover member has a first rigid plate,
the base member has:
a second rigid plate having a center opening; and
a film-like member having flexibility and laminated on a portion of the second rigid plate including the center opening, and
the carrier disassembling apparatus further comprises presser that presses the first rigid plate through the center opening.

8. The carrier disassembling apparatus as set forth in claim 7,
wherein the presser has:
a contact member having a contact plane that surface contacts with an exposed area of the film-like member exposed through the center opening; and
a mover that causes the contact member to move relative to the film-like member.

9. The carrier disassembling apparatus as set forth in claim 7, wherein
the presser has:
a contact member having a contact portion that substantially line contacts or point contacts with an exposed area of the film-like member exposed through the center opening; and
a mover that causes the contact member to move relative to the film-like member.

10. The carrier disassembling apparatus as set forth in claim 7, wherein
the presser has:
a contact member that contacts with an exposed area of the film-like member exposed through the center opening; and
a biasing member that biases the contact member toward the film-like member, and
the contact member contacts with the film-like member through the center opening when the carrier for test is placed on the first holding table.

11. The carrier disassembling apparatus as set forth in claim 1, wherein
the first holding table has an accommodating part to accommodate the base member, and
the carrier disassembling apparatus further comprises a dust collection apparatus having suction holes arranged around the accommodating part.

12. The carrier disassembling apparatus as set forth in claim 1, further comprising:
a dust collection apparatus having a suction hole and a dust collection cover connected with the suction hole.

13. The carrier disassembling apparatus as set forth in claim 1, further comprising:
an inserter that inserts a plate-like member between the cover member and the base member, and
a second holding table that holds the base member.

14. The carrier disassembling apparatus as set forth in claim 13, wherein the first holding table and the second holding table are provided as an identical table.

* * * * *